(12) United States Patent
Ho et al.

(10) Patent No.: US 7,123,522 B2
(45) Date of Patent: Oct. 17, 2006

(54) METHOD AND APPARATUS FOR ACHIEVING LOW POWER CONSUMPTION DURING POWER DOWN

(75) Inventors: Duc V. Ho, Allen, TX (US); Scott E. Smith, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/797,240

(22) Filed: Mar. 10, 2004

(65) Prior Publication Data

US 2005/0201178 A1    Sep. 15, 2005

(51) Int. Cl.
*G11C 7/00* (2006.01)
(52) U.S. Cl. .................. 365/189.11; 365/229
(58) Field of Classification Search ........... 365/189.11, 365/194, 226, 229, 191
See application file for complete search history.

(56) References Cited

U.S. PATENT DOCUMENTS 5,831,467 A * 11/1998 Leung et al. ............... 327/319
6,240,028 B1   5/2001 Ho
6,519,707 B1 * 2/2003 Clark et al. ................. 713/322
6,552,949 B1 * 4/2003 Silla et al. .................. 365/227
6,557,090 B1   4/2003 Ho
6,586,979 B1   7/2003 Gomm et al.

OTHER PUBLICATIONS

U.S. Appl. No. 10/750,735, filed Dec. 31, 2003, Ho et al.
U.S. Appl. No. 10/231,509, filed Aug. 29, 2002, Gomm et al.
U.S. Appl. No. 09/815,465, filed Mar. 23, 2001, Gomm et al.

* cited by examiner

*Primary Examiner*—Thong Q. Le
(74) *Attorney, Agent, or Firm*—Fletcher Yoder

(57) ABSTRACT

The present technique relates to a method and apparatus to provide a deep power down mode. In a memory device, such as DRAM or SRAM, various internal voltage buses provide power throughout the semiconductor chip. In a deep power down mode, grounding devices may be utilized to ground the internal voltage buses. With the internal voltage buses grounded, the outputs of the level shifters, which are control signals, may need to be forced into specific states. Through the use of the grounding devices and level shifters, leakage may be reduced and latch-up conditions may be reduced. As a result, the operation of the semiconductor chip may be enhanced because the problems associated with grounding the internal voltage buses may be diminished.

39 Claims, 11 Drawing Sheets

METHOD AND APPARATUS FOR ACHIEVING LOW POWER CONSUMPTION DURING POWER DOWN

BACKGROUND OF THE INVENTION

1. Field of the Invention

The present invention relates generally to semiconductor devices and, more particularly, to the management of power in a semiconductor device, such as a memory device.

2. Description of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Microprocessor-controlled integrated circuits are used in a wide variety of applications. Such applications include personal computers, telephones, portable devices, networks, and a host of consumer products. As is well known, microprocessors are essentially generic devices that perform specific functions under the control of a software program. This program is stored in a memory device that is coupled to the microprocessor. Not only does the microprocessor access memory devices to retrieve the program instructions, but it also stores and retrieves data created during execution of the program in one or more memory devices.

It should be understood that memory devices and integrated circuits are typically mass produced through fabrication processes to form semiconductor chips. In forming the chip, different materials are layered together to form various structures or circuitry within the chip. These structures are connected together to exchange signals, to receive power from external devices, and to distribute power throughout the chip. The power and signals are utilized by the structures within the semiconductor chip to perform specific functions. For instance, the distribution of power enables memory cells within a memory device to maintain data delivered from a microprocessor during the execution of a program.

Regardless of the specific structures being fabricated within the semiconductor chip, it is often desirable to conserve power by managing the power during standby or deep power down modes. For instance, in a device, such as a cellular telephone or a personal computing device, the semiconductor chips implemented may consume small amounts of power during a deep power down mode of operation. During the deep power down mode, the device may supply power to select components to maintain operation. Each of these components may include defects which result in junction leakage that consumes power. Also, the structures within the semiconductor chips may float and produce additional errors when the power is removed. These power consumption inefficiencies and associated problems may reduce the amount of time that the device is utilized in the normal or the deep power down mode of operation.

BRIEF DESCRIPTION OF THE DRAWINGS

The foregoing and other advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation may be described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The present technique is an improved approach for grounding internal voltage buses to conserve power and ensure that the various components within the semiconductor chip are powered "off" and in a predetermined state. Under the present technique, grounding devices may ground internal voltage buses, while level shifters may force control signals and components into specific states when the voltage buses are grounded. By controlling the state of control signals and components, the grounding devices and level shifters may prevent leakage and latch-up within the semiconductor chip. As a result, the operation of the semiconductor chip may be enhanced because the problems associated with grounding the internal voltage buses may be minimized.

Figure 1:
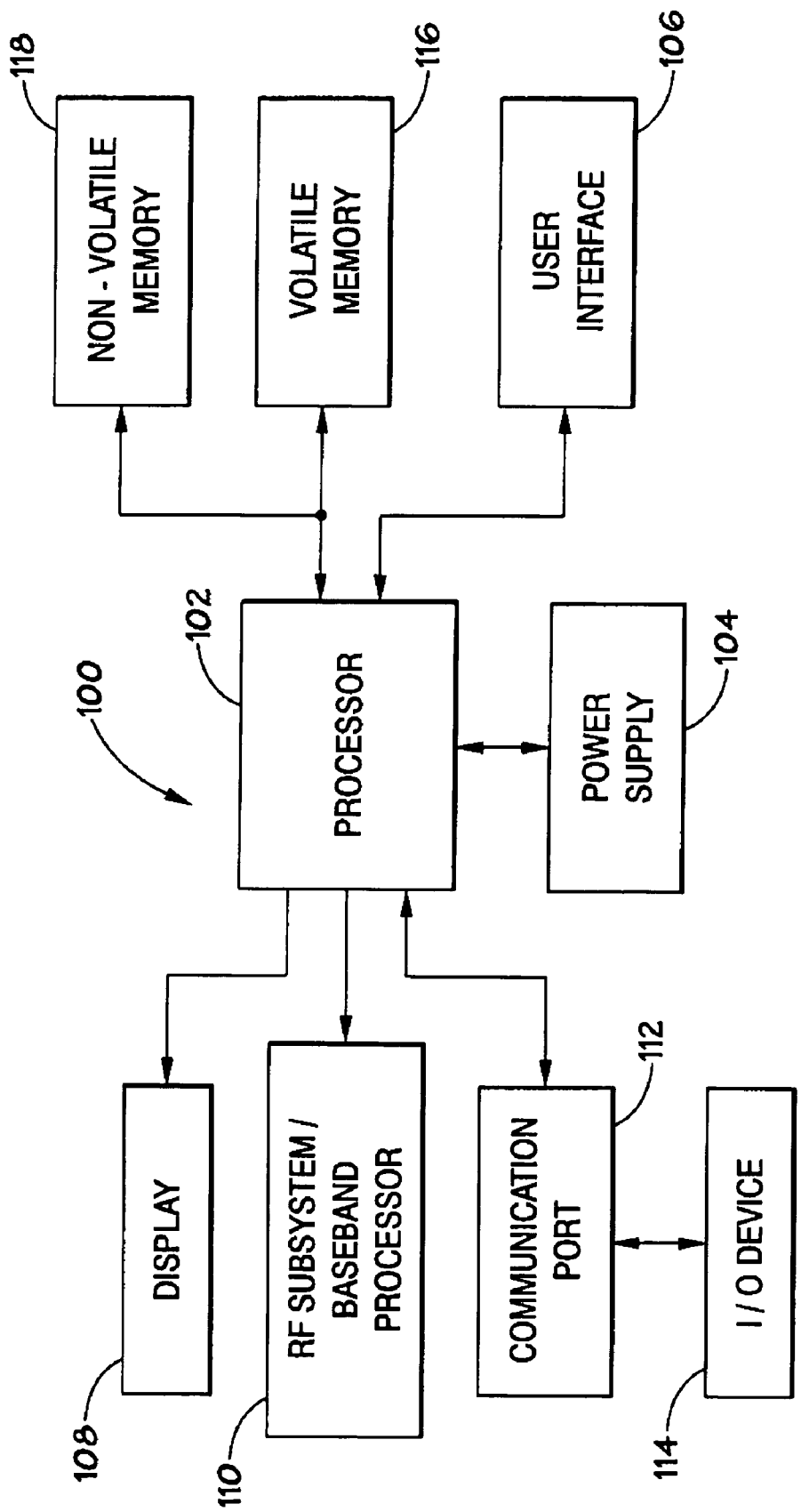
FIG. 1 illustrates a block diagram of an exemplary processor-based device that incorporates the present technique.

Turning now to the drawings, and referring initially to FIG. 1, a block diagram depicting an exemplary processor-based device, generally designated by the reference numeral 100, is illustrated. The device 100 may be any one of a variety of different types, such as a computer, pager, cellular telephone, personal organizer, control circuit, etc. In a typical processor-based device, a processor 102, such as a microprocessor, controls many of the functions of the device 100.

The device 100 typically includes a power supply 104. For instance, if the device 100 is portable, the power supply 104 may include permanent batteries, replaceable batteries, and/or rechargeable batteries. The power supply 104 may also include an A/C adapter, so that the device may be plugged into a wall outlet, for instance. In addition, the power supply 104 may include a D/C adapter, so that the device 100 may be plugged into a vehicle's cigarette lighter.

Various other components may also be coupled to the processor 102 depending upon the functions that the device 100 performs. For instance, a user interface 106 may be coupled to the processor 102 to allow a user to enter data into the device 100. The user interface 106 may include buttons, switches, a keyboard, a light pen, a mouse, and/or a voice recognition system. A display 108 may also be coupled to the processor 102 to present the user with information. The display 108 may include a liquid crystal display (LCD), a cathode ray tube (CRT), light emitting devices (LEDs), and/or an audio display. Furthermore, a radio frequency (RF) subsystem/baseband processor 110 may also be coupled to the processor 102 to communicate with other devices through a wireless link. The RF subsystem/baseband processor 110 may include an antenna that is coupled to an RF receiver and to an RF transmitter (not shown). Also, a communication port 112 may be coupled to the processor 102 to communicate with other devices through a physical link. The communication port 112 may be adapted to be coupled to a peripheral device 114, such as a modem, a printer, or a computer, for instance.

Because the processor 102 controls the functioning of the device 100, which is generally under the control of software programming, memory is coupled to the processor 102 to store and facilitate execution of the software programs. For instance, the processor 102 may be coupled to a memory device 116 that may be volatile memory, which may include dynamic random access memory (DRAM) and/or static random access memory (SRAM), for instance. The amount of DRAM and SRAM may depend on the specific design of the device 100. The processor 102 may also be coupled to a memory device 118 that is non-volatile memory. The memory device that is non-volatile memory 118 may include read only memory (ROM), such as an erasable programmable ROM (EPROM), to be used in conjunction with the memory device 116. The size of the ROM is typically selected to be just large enough to store any necessary operating system, application programs, and fixed data. The memory device 116 that is volatile memory, on the other hand, is typically quite large so that it can store dynamically loaded applications. Additionally, the memory device 118 that is non-volatile memory may include a high capacity memory, such as a disk or tape drive memory.

The processor-based device 100 may include numerous semiconductor chips in the various components that are utilized to provide the functionality to the device 100. For instance, the memory device 116 that is volatile memory and the memory device 118 that is non-volatile memory may be semiconductor chips that are coupled to the processor 102 to store the software programming for the operation of the processor-based device 100. The semiconductor chips may exchange signals with each other and with other components of the device 100 to perform their respective functions. As such, improvements in each of the semiconductor chips may improve the efficiency of the processor-based device 100 and provide reliable access to the information stored in the memory devices 116 and 118.

Figure 2:
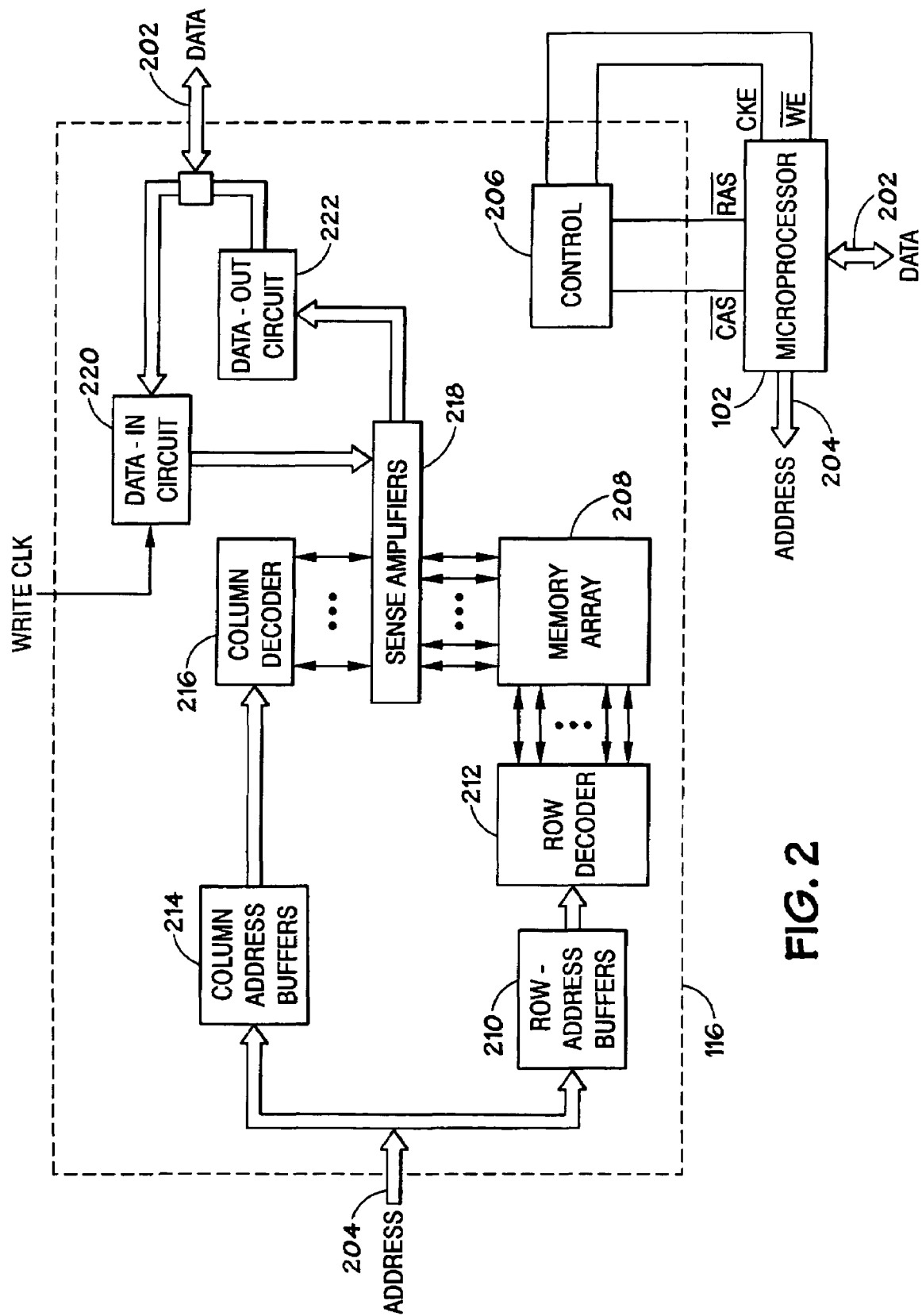
FIG. 2 illustrates a block diagram depicting an exemplary embodiment of a memory device utilized in the processor-based device of FIG. 1.

Turning now to FIG. 2, a block diagram depicting an exemplary embodiment of a memory device 116 that is volatile memory is illustrated. The description of the memory device 116 has been simplified for illustrative purposes and is not intended to be a complete description of all features in a memory device 116. Likewise, the present technique may not be limited to a memory device 116 being SRAMs or DRAMs, but may be applicable to other devices, such as memory buses, processors, network processors, application specific integrated circuits (ASICs), and intra-chip buses, which may benefit from reduced leakage and transition to specific states when internal voltage buses are grounded. As such, various devices may implement the present techniques.

During operation, the memory device 116 may receive various inputs that are utilized by various circuits within the memory device 116. For instance, individual inputs, such as control information, address information, and data, may be provided over a memory bus to the memory device 116. These individual representations of inputs are illustrated by a data bus or lines 202, address lines 204, and various discrete lines directed to control logic 206. The memory device 116 includes a memory array 208, which comprises rows and columns of addressable memory cells. To provide access to the memory cells, each memory cell in a row is coupled to a word line. Additionally, each memory cell in a column is coupled to a bit line. The word line and bit line may be utilized to access a storage capacitor through an access transistor in the memory array 208, for instance.

The memory device 116 interfaces with, for example, a processor 102, such as a microprocessor, through address lines 204 and data lines 202. Alternatively, the memory device 116 may interface with other devices, such as a memory controller, a microcontroller, a chip set, or another electronic system. The processor 102 may also provide a number of control signals to the memory device 116. Such control signals may include row and column address strobe signals RAS and CAS, a write enable signal WE, a clock enable signal CKE, and other conventional control signals. The control logic 206 controls many available functions of the memory device 116. In addition, various other control circuits and signals not detailed herein contribute to the operation of the memory device 116.

Row-address buffers 210 and a row decoder 212 receive and decode row addresses from row address signals provided on the address lines 204. Each unique row address corresponds to a row of cells in the memory array 208. The row decoder 212 typically includes a word line driver, an address decoder tree, and circuitry which translates a given row address received from the row-address buffers 210 and selectively activates the appropriate word line of the memory array 208 via the word line drivers.

A column address buffer 214 and a column decoder 216 receive and decode column address signals provided on the address lines 204. The column decoder 216 may also determine when a column is defective, as well as the address of a replacement column. The column decoder 216 is coupled to sense amplifiers 218. The sense amplifiers 218 are coupled to complimentary pairs of bit lines of the memory array 208, for example.

The sense amplifiers 218 are coupled to data-in (i.e., write) circuitry 220 and data-out (i.e., read) circuitry 222. The data-in circuitry 220 and the data-out circuitry 222 include data drivers and latches. During a write operation, the data bus 202 provides data to the data-in circuitry 220. The sense amplifier 218 receives data from the data-in circuitry 220 and stores the data in the memory array 208 as a charge on a capacitor of a cell at an address specified on the address lines 204.

During a read operation, the memory device 116 transfers data to the processor 102 from the memory array 208. Complimentary bit lines for the accessed cell are equilibrated during a precharge operation to a reference voltage provided by an equilibration circuit and a reference voltage supply. The charge stored in the accessed cell is then shared with the associated bit lines. The sense amplifier 218 detects and amplifies a difference in voltage between the complimentary bit lines. Address information received on address lines 204 selects a subset of the bit lines and couples them to complimentary pairs of input/output (I/O) wires or lines. The I/O wires pass the amplified voltage signals to the data-out circuitry 222 and eventually to the data bus 202. The data-out circuitry 222 may include a data driver (not shown) to drive data out onto the data bus 202 in response to a read request directed to the memory array 208. Further, the data-out circuitry 222 may include a data latch (not shown) to latch the read data until it is driven onto the data bus 202 by the data driver.

In operating the memory device 116, power may be distributed to different sections of the semiconductor chip or memory device 116, which may receive regulated or unregulated power for the internal voltage buses. The internal voltage buses may include an array voltage bus, a booted power voltage bus, a peripheral or operating voltage bus, and a delay lock loop voltage bus, for instance. These internal voltage buses may provide different voltage levels and isolation for specific components within the memory device 116. For example, the array voltage bus may provide voltage to the memory array 208, while the operating voltage bus may provide voltage to the row decoder 212, the column decoder 216, the sense amplifiers 218 and other circuitry in the memory device 116. In addition, the delay lock loop voltage bus may be isolated to minimize any interference from other circuitry.

As can be appreciated, it may be advantageous to conserve power during certain periods of inactivity. During power conservation it may be advantageous to maintain power to various components and to minimize the state of certain control signals to reduce the time associated with activating the memory device 116. As such, the memory device 116 may be designed to operate more efficiently by reducing current leakage and power loss from defects. For instance, the memory device 116 may be designed to disable current consuming circuits during inactive modes, such as a deep power down mode. By disabling circuits that consume power, the memory device 116 may be more efficient, which allows the processor based device 100 to remain active for longer periods of time and to operate more efficiently when operating in a stand-alone mode on a limited power source. The distribution of power in a semiconductor chip is explained in greater detail with FIG. 3.

Figure 3:
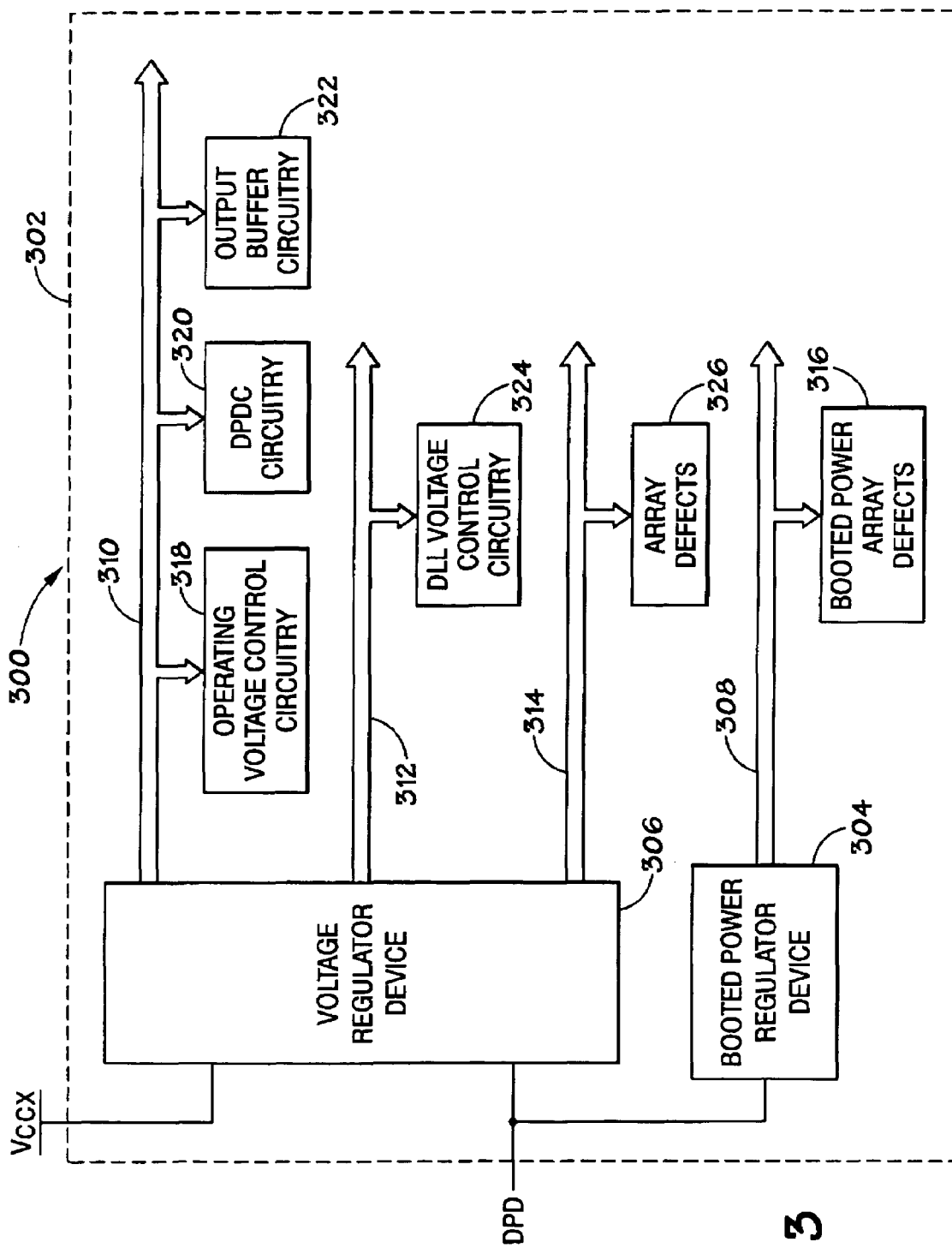
FIG. 3 illustrates a block diagram depicting an exemplary embodiment of a power distribution system within a semiconductor chip utilized in the memory device of FIG. 2.

Turning now to FIG. 3, a block diagram depicting an exemplary embodiment of a power distribution system within a semiconductor chip is illustrated. In this system 300, a semiconductor chip 302, which may be an exemplary embodiment of the memory device 116 of FIG. 2, may receive power from an external power supply (not shown), such as the power supply 104 of FIG. 1. A control signal, such as a deep power down signal DPD, may be provided to the power distribution system 300 for implementing a standby or power down mode of operation. During the power down mode, internal voltage buses or supplies may be grounded to minimize power consumption.

The deep power down signal DPD may be provided through a physical link, such as memory bus, to a booted power regulator device 304 and a voltage regulator device 306. The deep power down signal DPD may be generated from the processor 102 of FIG. 1, or another control circuit (not shown) that manages the power for the semiconductor chip 302. The deep power down signal DPD may indicate that the system 300 is entering into a power down mode, which is a power conservation state for the semiconductor chip 302. Accordingly, each of the internal voltage buses, such as a booted power voltage bus 308, a primary peripheral or operating voltage bus 310, a delay lock loop (DLL) voltage bus 312, and an array voltage bus 314, may be grounded to achieve low power consumption.

The booted power regulator device 304 may supply power to a booted power voltage bus 308 that provides a booted power voltage $V_{CCP}$ to various components of the semiconductor chip 302. In one exemplary embodiment, the booted power voltage bus 308 may operate in a range from 0 to 3.2 or 3.6 volts, which is about 1.4 volts above an operating voltage source $V_{CC}$ on the primary operating voltage bus 310. Leakage by components coupled to the booted power voltage bus 308 may occur when the chip is operating in power down mode. The leakage is generally illustrated as booted power array defects 316.

In addition, the deep power down signal DPD may be provided to a voltage regulator device 306. The voltage regulator device 306 may be utilized to ground regulated voltage buses, such as the operating voltage bus 310, the DLL voltage bus 312, and the array voltage bus 314. The operating voltage bus 310 may apply an operating voltage $V_{CC}$, which may be in the range of 0 to 1.6 or 2.0 volts, to various circuitry, such as a operating voltage control circuitry 318, a deep power down control (DPDC) circuitry 320, and/or an output buffer circuitry 322. The operating voltage control circuitry 318 may regulate the voltage applied to level shifters that are coupled to the external voltage $V_{CCX}$. The DPDC circuitry 320 may distribute the deep power down signal to various devices within the memory device, while the output buffer circuitry 322 may include output buffers and output drivers that provide output signals. Similarly, the delay lock loop voltage bus 312 may apply a regulated DLL voltage $V_{CC\_DLL}$ to DLL voltage control circuitry 324 that maintains the voltage on the DLL voltage bus 312. The DLL voltage bus 312 may be an isolated bus that is utilized by circuitry that measures the time for outputs to fire, for instance. The array voltage bus 314 may apply an array voltage $V_{CCA}$ to array defects 326, which represent leakage by components coupled to the array voltage bus 314 when the semiconductor chip 302 is operating in the deep power down mode. By grounding the voltage buses 310–314, the source of leakage, which may be from components or structures coupled to the external voltage source $V_{CCX}$, may be reduced.

However, the grounding of the internal voltage buses 308–314 may present problems for the level shifters in the semiconductor chip 302. The level shifters may be utilized as bridges to transform signals from different voltages to provide communication between circuitry operating at different voltages. The level shifters utilize the internal regulated power from the internal voltage buses 308–314 to translate signals into external signals. When the internal voltage buses are grounded, the level shifters may provide undetermined results or float. Accordingly, the level shifters may be set to determined logic levels to reduce contention and leakage through the use of the deep power down signal, while the grounding devices may be coupled to the buses 308–314 to reduce any leakage. The operation of the grounding devices within the voltage regulators 304 and 306 is explained in greater detail in the embodiments of FIGS. 4 and 5, while the operation of the level shifters is explained in greater detail in the embodiments of FIGS. 6–11.

Figure 4:
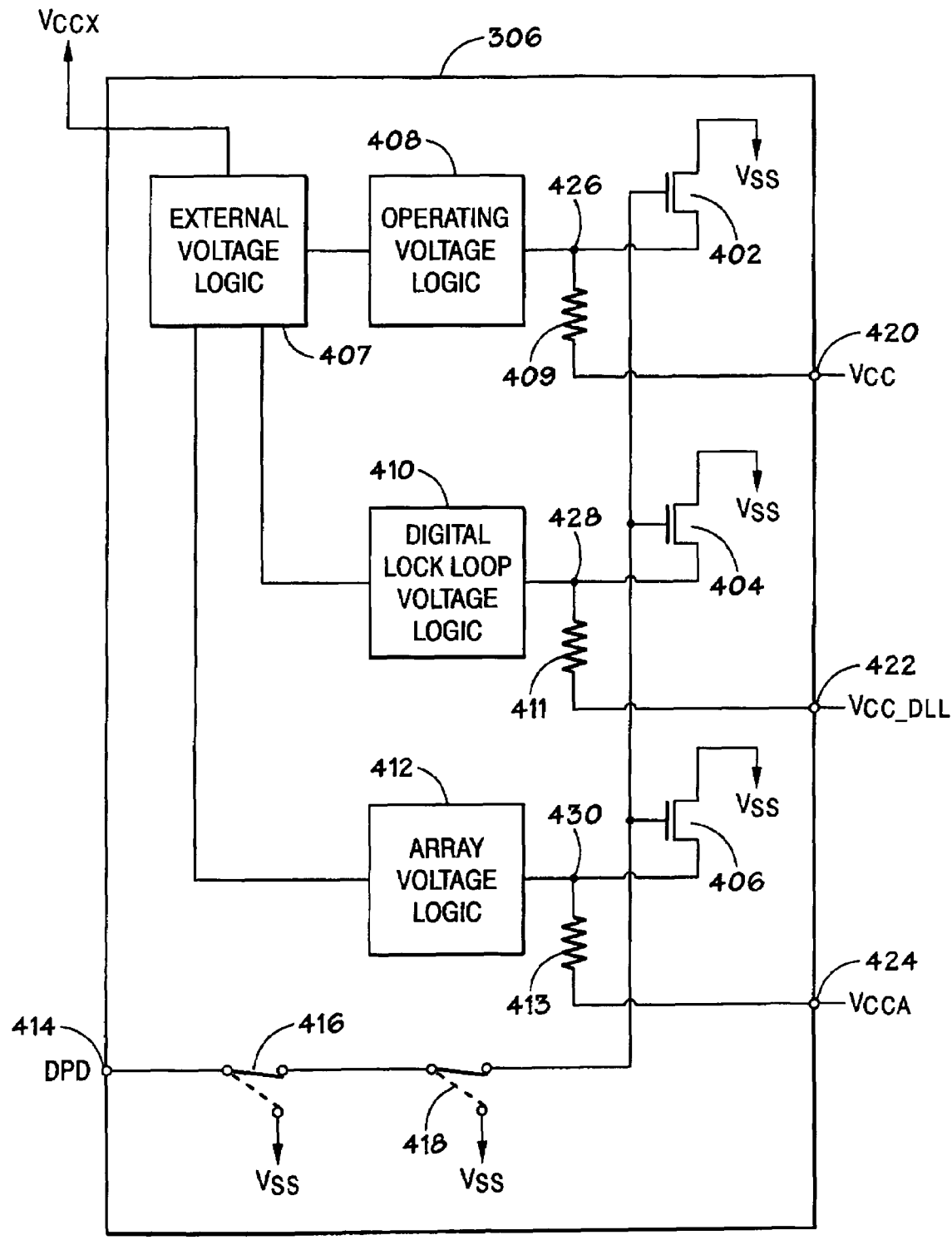
FIG. 4 illustrates a schematic diagram depicting an exemplary embodiment of a voltage regulator device in the semiconductor chip of FIG. 3.

In FIG. 4, a schematic diagram depicting an exemplary embodiment of a voltage regulator device, such as the voltage regulator device 306 of FIG. 3, is illustrated. The voltage regulator device 306 may provide voltages to different buses 310–314 during the normal mode of operation, as discussed above. Also, the voltage regulator device 306 may include grounding devices 402–406, which are utilized to ground the respective buses 310–314 during the deep power down mode. While the grounding devices 402–406 may be any type of circuitry, for exemplary purposes, they are shown as transistors in the present embodiment. By utilizing these grounding devices 402–406, the voltage regulator device 306 may either provide regulated power to the respective internal voltage buses 310–314 or ground the internal voltage buses 310–314 depending on the mode of operation.

The voltage regulator device 306 may include logic 407, 408, 410, and 412 utilized to provide the respective regulated voltages to the different buses 310–314. For instance, an external voltage logic 407 may be utilized to receive the external voltage source $V_{CCX}$ and provide a control signal to an operating voltage logic 408, a DLL voltage logic 410, and an array voltage logic 412. The operating voltage logic 408 may receive the control signal along with the external voltage source $V_{CCX}$ to provide the operating voltage $V_{CC}$ for the operating voltage bus 310 through a first resistor 409 at a first output terminal 420. The DLL voltage logic 410 may receive the control signal along with the external voltage source $V_{CCX}$ to provide the delay lock loop voltage $V_{CC\_DLL}$ for the delay lock loop voltage bus 312 through a second resistor 411 at a second output terminal 422. The array voltage logic 412 may receive the control signal along with the external voltage source $V_{CCX}$ to provide the array voltage $V_{CCA}$ to the array voltage bus 314 via a third resistor 413 at a third output terminal 424. Through the use of the logic 407, 408, 410, and 412, the respective voltages may be applied to the voltage buses 310–314.

In addition, the voltage regulator device 306 may include grounding devices 402–406 that are utilized to ground the internal voltage buses 310–314 during the deep power down mode. The grounding devices 402–406 may include thick oxide channels to prevent leakage from the logic 408, 410, and 412 to the low voltage source $V_{SS}$, which may be ground or a voltage of lower potential than the voltages supplied through the logic 408–412. For instance, an operating voltage grounding device 402 may be coupled between the operating voltage logic 408 at a node 426 and a low voltage source $V_{SS}$ via the respective source and drain. Similarly, the DLL voltage grounding device 404 may be may be coupled between the DLL voltage logic 410 at a node 428 and the low voltage source $V_{SS}$, while the array voltage grounding device 406 may be coupled between the array voltage logic 412 at a node 430 and the low voltage source $V_{SS}$. Each respective gate of the grounding devices 402–406 may be coupled to an input 414 through a first switch 416 and a second switch 418. The switches 416 and 418 may be metal switches, which act as shorts to the gates or connect to the low voltage source $V_{SS}$, depending on the internal voltage bus. Through the use of the grounding devices 402–406, the respective internal voltages buses 310–314 may be grounded during the deep power down mode.

During the normal mode of operation, the voltage regulator device 306 may receive the external voltage $V_{CCX}$ from an external power supply (not shown). The external voltage $V_{CCX}$ may be modified by the logic 407, 408, 410, and 412 before being delivered to the various buses 310–314. In this mode, the deep power down signal DPD may indicate that the voltage regulator device 306 is operating in the normal mode of operation. This indication may be through a logical low signal, such as a "0." As such, the voltage regulator device 306 may manage and/or control the voltage provided to the various buses, such as the operating voltage bus 310, the DLL voltage bus 312 and the array voltage bus 314. Also, in this mode, the grounding devices 402–406 are open to isolate the voltage applied to the respective buses 310–314 from the low voltage source $V_{SS}$.

In the deep power down mode, the deep power down signal DPD may be received at the input 414 of the voltage regulator device 306. The deep power down signal DPD may indicate that the voltage regulator device 306 is in the deep power down mode, which may be indicated by a logical high signal, such as a "1." The deep power down signal DPD is delivered to the gates of the grounding devices 402–406 through the metal switches 416 and 418, which are closed to act as a short between the input 414 and the gates of the grounding devices 402–406. The deep power down signal DPD closes the gates of the grounding devices 402–406 to couple the buses 310–314 to the low voltage source $V_{SS}$, respectively. In this manner, the voltage regulator device 306 grounds the voltage buses 310–314 through the use of the grounding devices 402–406.

Figure 5:
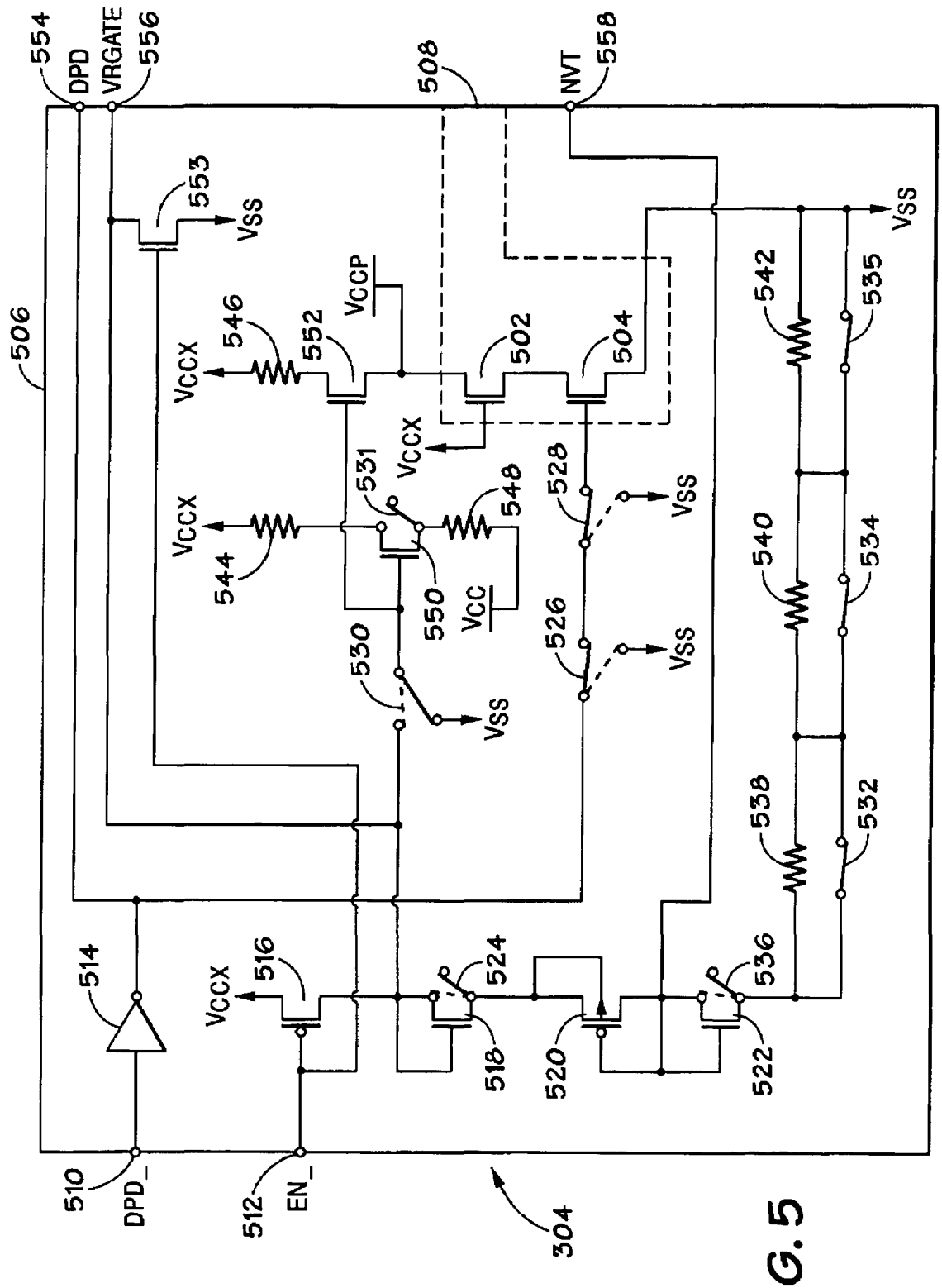
FIG. 5 illustrates a schematic diagram depicting an exemplary embodiment of a booted power regulator device in the semiconductor chip of FIG. 3.

Similar to the grounding of the voltage buses 310–314 in the voltage regulation device 306, the booted power regulator device 304 may be utilized to ground the booted power voltage bus 308. As shown in FIG. 5, a schematic diagram depicting an exemplary embodiment of a booted power regulator device, such as the booted power regulator device 304 of FIG. 3, is illustrated. The booted power regulator device 304 may provide the booted power voltage $V_{CCP}$ to the booted power voltage bus 308, as discussed above with reference to FIG. 3. However, in the deep power down mode, the booted power regulator device 304 may utilize a booted power punch device 502 along with a booted power grounding device 504 to ground the booted power voltage bus 308. For exemplary purposes, the booted power punch device 502 and the booted power grounding device 504 are shown as transistors. By utilizing the booted power punch device 502 with the booted power grounding device 504, the booted power regulator device 304 may provide regulated booted power voltage $V_{CCP}$ to the booted power voltage bus 308 or ground the booted power voltage bus 308 depending on the mode of operation.

The booted power regulator device 304 may include a first portion 506 and a second portion 508 that are utilized to ground or provide voltage to the booted power voltage bus 308. The first portion 506 includes a first input terminal 510 that receives a complimentary deep power down signal DPD_ and a second input terminal 512 that receives a complimentary enable signal EN_. The signals are provided to various logic, such as an inverter 514, transistors 516, 518, 520, 522, 550, 552, and 553, switches 524, 526, 528, 530, 531, 532, 534, 535, and 536, resistors 538, 540, 542, 544, 546, and 548, a first output terminal 554, a second output terminal 556, and a third output terminal 558. From the various logic, the signals are provided from the first portion 506 to the second portion 508 of the booted power regulator device 304.

The second portion 508 of the booted power regulator device 304 includes the booted power punch device 502 and the booted power grounding device 504. The booted power punch device 502 and the booted power grounding device 504 may be coupled between the booted power voltage source $V_{CCP}$ that is connected to the source or drain of the transistor 552 and the low voltage source $V_{SS}$ via the respective sources and drains. The gate of the booted power punch device 502 is coupled to the external voltage source $V_{CCX}$, while the gate of the booted power grounding device 504 is coupled to the switch 528. By utilizing the booted power punch device 502 with the booted power grounding device 504 in this configuration, the booted power regulator device 304 may provide regulated booted power voltage $V_{CCP}$ to the booted power voltage bus 308 or ground the booted power voltage bus 308 depending on the signal received at the booted power grounding device 504.

For instance, during the deep power down mode, the booted power grounding device 504 receives the deep power down signal DPD via the switches 526 and 528 to ground the booted power voltage bus 308 of FIG. 3. If the booted power punch device 502 and the booted power grounding device 504 are N-channel (MOSFET) transistors, the external voltage source $V_{CCX}$ closes the gate of the booted power punch device 502, and the deep power down signal DPD closes the gate to the booted power grounding device 504. As a result, the booted power voltage source $V_{CCP}$ is coupled to the low voltage source $V_{SS}$ through the booted power punch device 502 and the booted power grounding device 504. As such, the booted power regulator device 304 grounds the booted power voltage source $V_{CCP}$ when the deep power down signal DPD is present.

During the normal mode of operation, the booted power punch device 502 prevents the booted power voltage source $V_{CCP}$ from "punching through" (i.e. unintended high current flow between the source and drain regions created by a sufficient voltage being applied across the source and drain region) the booted power grounding device 504 to the low voltage source $V_{SS}$ by lowing the voltage at the source of the booted power grounding device 504. With the voltage at the source of the booted power grounding device 504 being lowered, the electric field across the booted power grounding device 504 is reduced, which prevents punch through. Punch through is undesirable because it increases the output conductance, which may be referred to as a "soft breakdown." As such, the booted power regulator device 304 is able to continue to operate without loss when the system is operating in the normal mode of operation.

Advantageously, by grounding the voltage buses 308–314, as shown in FIGS. 4 and 5, the current consuming circuits on the buses 308–314 are disabled. This means that the junction leakage and the leakage from defects are reduced. With the voltage buses 308–314 being grounded, the remaining source of leakage is from devices or structures that are connected directly to the external power supply.

However, as noted above, grounding of the buses 308–314 may introduce problems for the level shifters because the level shifters rely on the internal voltage buses 308–314 to translate to the higher external voltages, such as the external voltage $V_{CCX}$. With the internal voltage buses 308–314 being grounded, the level shifters may cause contention or leakage. In addition, latch-up may occur from the leakage. To address these concerns, the level shifters may be disabled and forced into a determined state when the internal voltage buses are grounded in accordance with embodiments of the present techniques.

Figure 6:
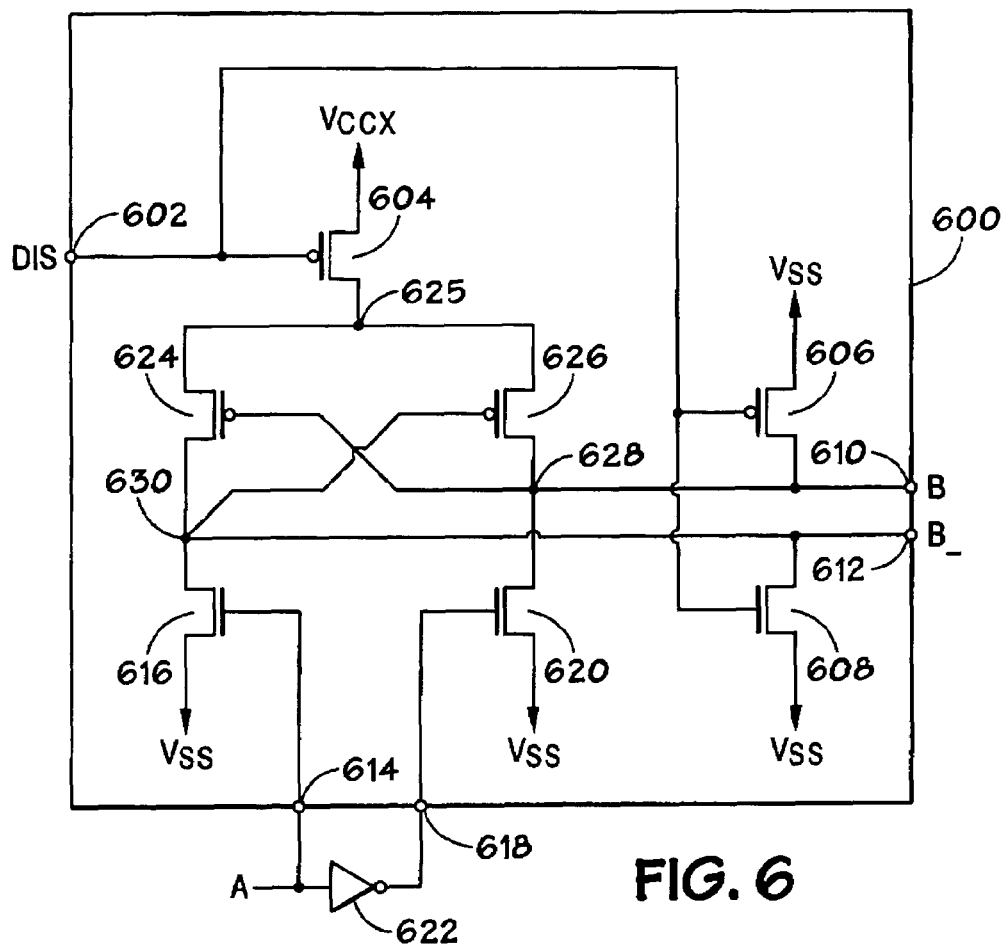
FIG. 6 illustrates a schematic diagram depicting an exemplary embodiment of a level shifter that may be utilized within the semiconductor chip of FIG. 3.

In FIG. 6, a schematic diagram depicting an exemplary embodiment of a level shifter 600 that may be utilized in the operating voltage control circuitry 318, the DPDC circuitry 320, the output buffer circuitry 322, and/or the DLL voltage control circuitry 324, is illustrated. The level shifter 600 may include a disable input terminal 602 for receiving a disable control signal DIS, which may be the deep power down signal DPD. Through this input terminal 602, the disable control signal DIS may control deep power down management devices, such as a first transistor 604, a second transistor 606, and a third transistor 608. Through the use of these transistors 604–608, an output signal B at a first output terminal 610 and output signal B_ at a second output terminal 612 may be forced into a determined state, such as a low state.

To provide the output signals B and B_, a first input terminal 614 is connected to a gate of a transistor 616, while a second input terminal 618 is connected to a gate of a transistor 620 through an inverter 622. The first input terminal 614 and the second input terminal 618 receive the input signals A and A_, which are complimentary signals that may represent data or a signal being converted to another voltage level. The transistor 616 may be coupled in series between a transistor 624 that is coupled to the first transistor 604 and the low voltage source $V_{SS}$ via the respective sources and drains. The low voltage source $V_{SS}$ may be ground or a voltage source of lower potential than an external voltage source $V_{CCX}$. The transistor 620 may be coupled in series between a transistor 626 that is connected to the first transistor 604 and the low voltage source $V_{SS}$ via the respective sources and drains. The gate of the transistor 624 may be coupled to the first output terminal 610 at a node 628 that is between the transistor 626 and the transistor 620. The gate of the transistor 626 may be coupled to the second output terminal 612 at a node 630 that is between the transistor 624 and the transistor 620. As an example of a specific embodiment, the transistors 606, 608, 616, and 620 may be N-channel (MOSFET) transistors, while the transistors 604, 624, and 626 may be P-channel (MOSFET) transistors.

To force the outputs signals B and B_ into a low state, the level shifter 600 may include the disable input terminal 602 that receives the disable control signal DIS. The disable input terminal 602 may be coupled to the gates of the first transistor 604, the second transistor 606, and the third transistor 608. The first transistor 604 may be coupled between the first voltage source $V_{CCX}$ and the transistors 624 and 626 at a node 625. The second transistor 606 may be coupled between the low voltage source $V_{SS}$ and the gate of the transistor 624, the first output terminal 610, and the respective source and drain of the transistor 620 and the transistor 626 at the node 628. The third transistor 608 may be coupled between the low voltage source $V_{SS}$ and the gate of the transistor 626, the second output terminal 612, and the respective source and drain of the transistor 616 and the transistor 624 at the node 630. Through these transistors 604–608, the first output terminal 610 and the second output terminal 612 may be coupled to ground to force the output signal B and B_ into a low state and to prevent the output signals B and B_ from floating.

To operate the level shifter 600, a "low" or "high" disable control signal DIS may be applied to the disable input terminal 602. Similarly, "low" or "high" input signals A and A_ may be applied to the first and second input terminals

614 and 618, respectively. By applying a disable control signal DIS that is "high," which indicates the deep power down mode, the first transistor 604 is opened from the first voltage source $V_{CCX}$ and the transistors 606 and 608 are closed to ground the output signals B or B_. Accordingly, the output signals B and B_ are forced into the low state on the output terminals 610 and 612, regardless of the input signals A and A_. However, if the disable control signal DIS that is applied to the disable input terminal 602 is "low," which indicates the normal mode of operation, the level shifter 600 may produce various output signals B and B_ based on the input signals A and A_ being applied to the input terminals 614 and 618.

From the level shifter 600, two general types of output signals B and B_ may be produced. In the normal mode of operation, the input signal A determines the output signals B and B_ because the disable signal is "low." If the input signal A applied to the first input terminal 614 is "high," then the complimentary input signal A_ applied to the second input terminal 618 is "low." As a result, the output signal B at the first output terminal 610 is "low," and the output signal B_ at the second output terminal 612 is "high," because more current flows across the transistor 616. Further, if the input signal A applied to the first input terminal 614 is "low," then the complimentary input signal A_ applied to the second input terminal 618 is "high." As a result, the output signal B at the first output terminal 610 is "high," and the output signal B_ at the second output terminal 612 is "low," because more current flows across the transistor 616. As such, while the deep power down signal DPD is "low," the level shifter 600 operates normally. However, if the disable signal is "high," the outputs B and B_ are grounded through the transistors 606 and 608, regardless of the input signals A and A_. Thus, the level shifter 600 may function normally when the internal voltage buses have power or may be disabled when the internal voltage buses are grounded.

Advantageously, by grounding the outputs terminals 610 and 612, the output signals B and B_ from the level shifter 600 do not float when the internal buses 308–314 of FIG. 3 are grounded. This means that the level shifter 600 may be disabled to a predetermined logic state that does not create contention or leakage. As a result, the level shifter 600 may be utilized in various circuitry to provide determined outputs when the internal buses 308–314 of FIG. 3 are grounded. To provide the determined outputs, the level shifter 600 may be a pull-up level shifter or a pull-down level shifter, as discussed below in FIG. 7.

Figure 7:
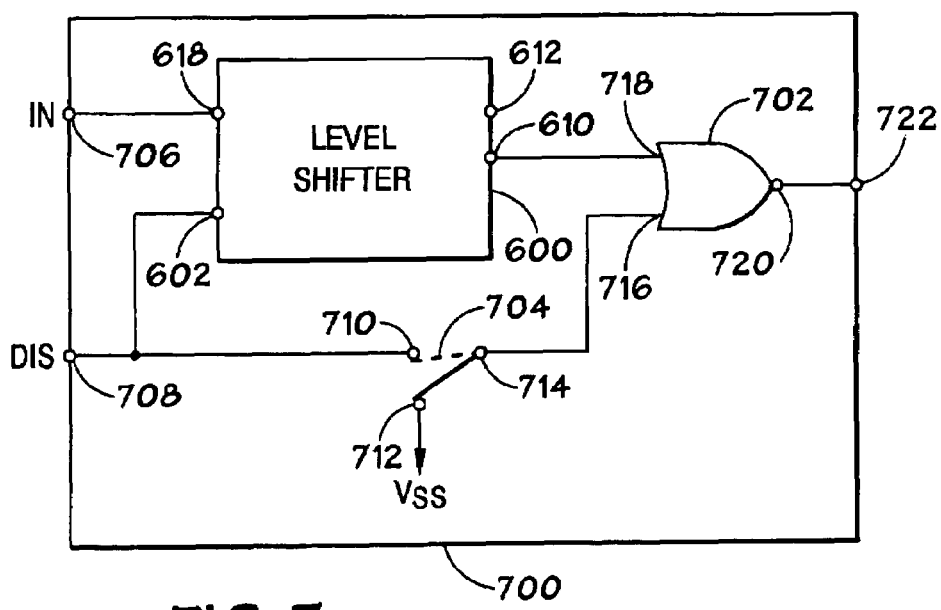
FIG. 7 illustrates a schematic diagram depicting an exemplary embodiment of a determined level shifter that incorporates the level shifter of FIG. 6.

In FIG. 7, a schematic diagram depicting an exemplary embodiment of a determined level shifter 700, which may include a specific embodiment of the level shifter 600 of FIG. 6 with additional circuitry, is shown. The determined level shifter 700 may include the level shifter 600 that is coupled to logic to force the output signal of the level shifter 600 into a specific state when the deep power down mode is indicated. The specific state may be a logical high state, which is indicated by a "1," or a logical low state, which is indicated by a "0." By utilizing these states, the determined level shifter 700 may be utilized to provide a specific signal when the internal voltage buses are grounded. This may prevent latch-up that may result from leakage within the device.

The determined level shifter 700 may include a logic device 702, such as a "NOR" gate, and a switch 704 that are utilized with the level shifter 600 to force the determined level shifter 700 into a specific state. The first input terminal 706 of the determined level shifter 700 may be coupled to the second input terminal 618 of the level shifter 600. A second input terminal 708 of the determined level shifter 700 may be coupled to a first terminal 710 of the switch 704 and the disable input terminal 602 of the level shifter 600. A second terminal 712 of the switch 704 may be connected to the low voltage source $V_{SS}$ or ground. A gate 714 of the switch 704 may be coupled to a first input terminal 716 of the logic device 702, while a second input terminal 718 of the logic device 702 may be coupled to the first output terminal 610 of the level shifter 600. An output terminal 720 of the logic device 702 may be coupled to an output terminal 722.

Through this configuration, the determined level shifter 700 may generate a "high" signal or a "low" signal that forces the control signal into a specified state. When the disable signal DIS is "low," which indicates the normal mode of operation, the first input terminal 716 of the logic device 702 is "low" regardless of the position of the switch 704, which is either coupled to the low voltage source $V_{SS}$ or shorted to receive the disable signal DIS. Accordingly, the level shifter 600 provides the appropriate signal that is based on the signal received at the level shifter 600. Because the output terminals 610 and 612 of the level shifter 600 are not grounded, the signal delivered to the second input terminal 718 of the logic device 702 is a result of the signal that entered the level shifter 600. As such, the signal provided from the level shifter 600 determines the signal at the output terminal 722 of the determined level shifter 700.

In this configuration, the specified state from the determined level shifter 700 may be managed through the use of the switch 704 to form a pull-up level shifter or a pull-down level shifter. For instance, the determined level shifter 700 may be a disabled-high or pull-up level shifter when the switch 704 is coupled to the low voltage source $V_{SS}$ or ground. By coupling the gate 714 to the second terminal 712, the first input terminal 716 of the logic device 702 is "low" because the first input terminal 716 is coupled to the low voltage source $V_{SS}$ or ground. If the disable signal DIS is "high," which indicates that the deep power down mode is active, the second input terminal 718 of the logic device 702 is "low" because the level shifter 600 provides "low" signals, when the disable signal DIS is "high." As a result, the signal at the output terminal 722 is "high" because both input signals received at the logic device 702 are "low." Thus, the determined level shifter 700 generates a signal that is "high," when the level shifter 600 receives a signal that indicates the deep power down mode, and the switch 704 is coupled to the low voltage source $V_{SS}$.

Alternatively, the determined level shifter 700 may be a disabled-low or pull-down level shifter when the switch 704 is coupled to the disable signal DIS. For instance, by coupling the gate 714 to the first terminal 710, the first input terminal 716 of the logic device 702 is "high" because the first input terminal 716 is coupled to the disable signal DIS, which is a high signal when deep power down mode is indicated. If the disable signal DIS is "high," the second input terminal 718 of the logic device 702 is "low" because the level shifter 600 provides low signals, when the disable signal DIS is "high." As a result, the signal at the output terminal 722 is "low" because the input signals at the logic device 702 are "low" and "high." Thus, the determined level shifter 700 generates a signal that is "low," when the level shifter 600 receives a signal that indicates the deep power down mode, and the switch 704 is coupled to input terminal 708.

Advantageously, by forcing the outputs of the level shifter 600 into a high or low state, the determined level shifter 700 may force the control signals received at the level shifter into a specified state. This means that the predetermined level shifter 700 may be a pull-up or a pull-down level shifter depending on the state of the switch 704. As a result, the determined level shifter 700 may be utilized in various circuitry to control the operation during a deep power down mode. An exemplary embodiment of the use of the determined level shifter 700 in a regulator control, which may be the operating voltage control circuitry 318, the DPDC circuitry 320, or the DLL voltage control circuitry 324 of FIG. 3, is shown in greater detail in FIG. 8.

Figure 8:
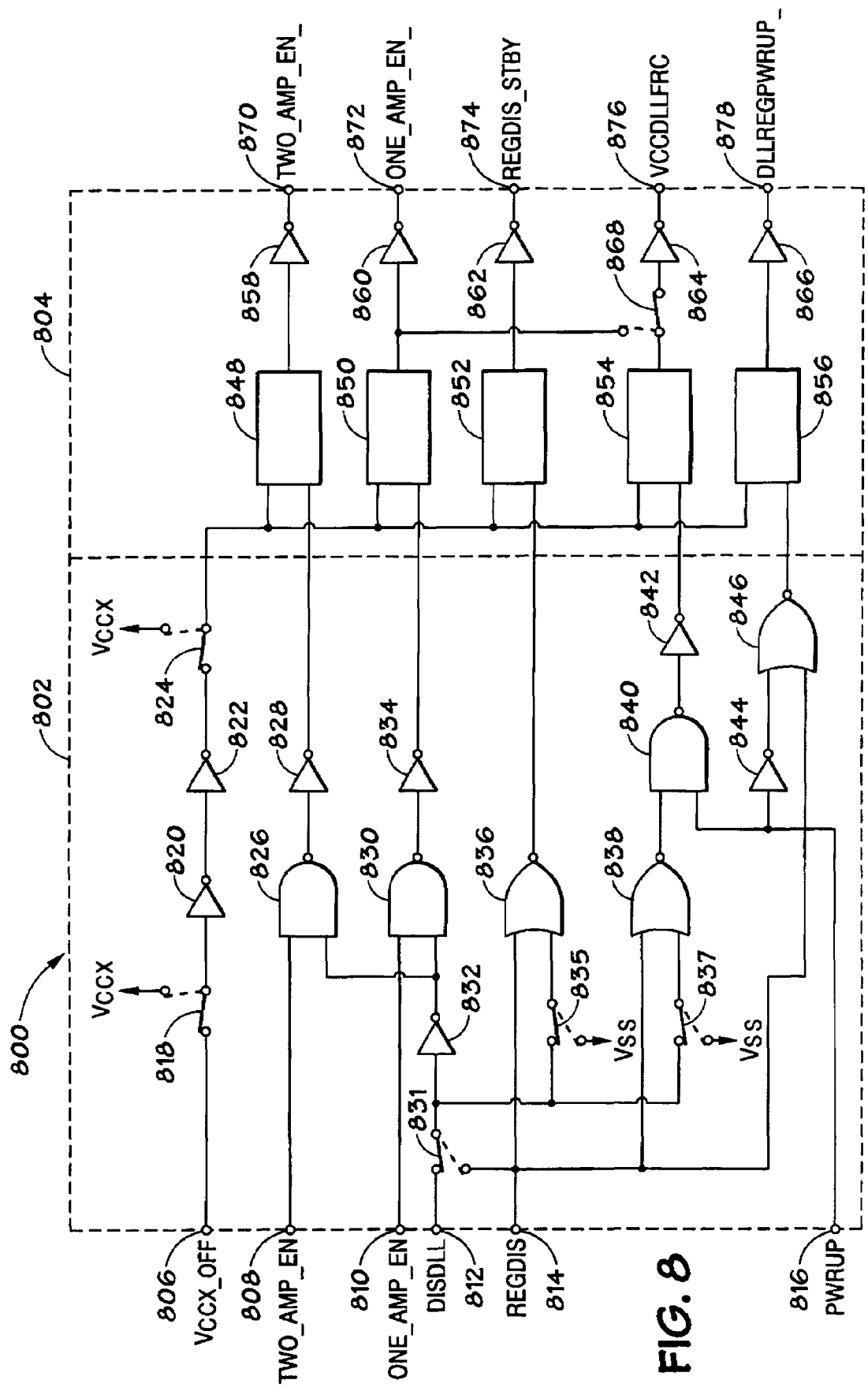
FIG. 8 illustrates a schematic diagram depicting an exemplary embodiment of a regulator control that utilizes the determined level shifter of FIG. 7.

In FIG. 8, a schematic diagram depicting an exemplary embodiment of a regulator control 800 that includes level shifters, such as the determined level shifter 700, is illustrated. As discussed further below, the level shifters may be utilized to force the control signals utilized by the regulator control 800 into a specific state to prevent the control signals from floating when the internal voltage buses, such as voltage buses 308–314 of FIG. 3, are grounded. As a result, the regulator control 800 may be managed by a local signal that indicates the deep power down mode is active.

The regulator control 800 may include a first portion 802 that receives control signals and a second portion 804 that utilizes the determined level shifters 700 to manage the state of the regulator control output signals. The first portion 802 may include a first input terminal 806, a second input terminal 808, a third input terminal 810, a fourth input terminal 812, a fifth input terminal 814, and a sixth input terminal 816, which may receive control signals. The control signals may include an operating voltage status control signal VCCR_OFF, current enable control signals ONEAMP_EN and TWOAMP_EN, disable DLL control signal DISDLL, regulator disable control signal REGDIS, and a power status control signal PWRUP. The operating voltage status control signal VCCR_OFF may be a local control signal that is generated by functions of deep power down, wafer level burn-in, regulated (XVHI) verses unregulated (XVLO), and/or double data rate (DDR) verses single data rate (SDR) signals. The control signals may be delivered to various logic, such as switches 818, 824, 831, 835 and 837, inverters 820, 822, 828, 832, 834, 842 and 844, logic devices 826, 830, 836, 838, 840 and 846. From the various logic, the signals are provided from the first portion 802 to the second portion 804 of the regulator control 800.

The second portion 804 of the regulator control 800 receives the signals from the first portion 802, which is provided to a first level shifter 848, a second level shifter 850, a third level shifter 852, a fourth level shifter 854, and a fifth level shifter 856. These level shifters 848–856, which may be embodiments of the level shifter 700 of FIG. 7, provide adjusted signals to various components, such as respective inverters 858–866 and a switch 868. From the inverters 858–866, the regulator control output signals are delivered to output terminals 870–878. The regulator control output signals may include current enable control signals ONE_AMP_EN and TWO_AMP_EN, regulator disable standby control signal REGDIS_STBY, a operating voltage DLL control signal VCCDLLFRC, and a DLL regulator power status control signal DLLREGPWRUP_. In this embodiment, the control output signals may be forced into a low or high signal state even when the operating voltage $V_{CC}$ is zero.

For instance, each of the level shifters 848–856 may be coupled to the control signal VCCR_OFF that indicates that the deep power down mode is being entered. If the level shifters 848–852 are to be placed in a low state, then the level shifters 848–852 may be the pull-down level shifters with the switch 704 coupled to the second input terminal 708 (FIG. 7). Similarly, if the level shifters 854 and 856 are to be placed in a high state, then the level shifters 854 and 856 may be the pull-up level shifters with the switch 704 coupled to the low voltage source $V_{SS}$ or ground (FIG. 7). As a result, when the deep power down mode is indicated, the control signal VCCR_OFF may be "high." When this signal is "high," each of the level shifters 848–852 produce a low signal and the level shifters 854 and 856 produce a high signal. Accordingly, the current enable control signals ONE_AMP_EN and TWO_AMP_EN and the regulator disable standby control signal REGDIS_STBY may produce high signals from the inverters 858–862, while the operating voltage DLL control signal VCCDLLFRC and a DLL regulator power status control signal DLLREGPWRUP_may provide low signals from the inverters 864 and 866. As such, through the use of a local signal, such as the control signal VCCR_OFF, the states of the respective control signals may be managed with the determined level shifters 700 of FIG. 7, illustrated here as level shifters 848–856.

Similar to the discussion of the level shifter 600 of FIG. 6 and the level shifter 700 of FIG. 7, a pull-up level shifter 900 (FIG. 9) and a pull-down level shifter 1000 (FIG. 10) may be utilized to ground the output buffers in the output buffer circuitry 322 when the operating voltage source $V_{CC}$ is grounded. The level shifters 900 and 1000 are unique because these level shifters 900 and 1000 are in the timing path and limited by layout constraints. As these level shifters 900 and 1000 drive large capacitive loads in the pre-output buffer stage, the addition of load or disablement of the pull-up driver slows the propagation timing. Also, the addition of larger structures presents the problem of extra space being consumed. However, the level shifters 900 and 1000 may be slowly charged or discharged to control the polarity of the output signals to turn "off" the output buffers. The use of the level shifters 900 and 1000 in the output buffer circuitry 322 is discussed below in further detail.

Figure 9:
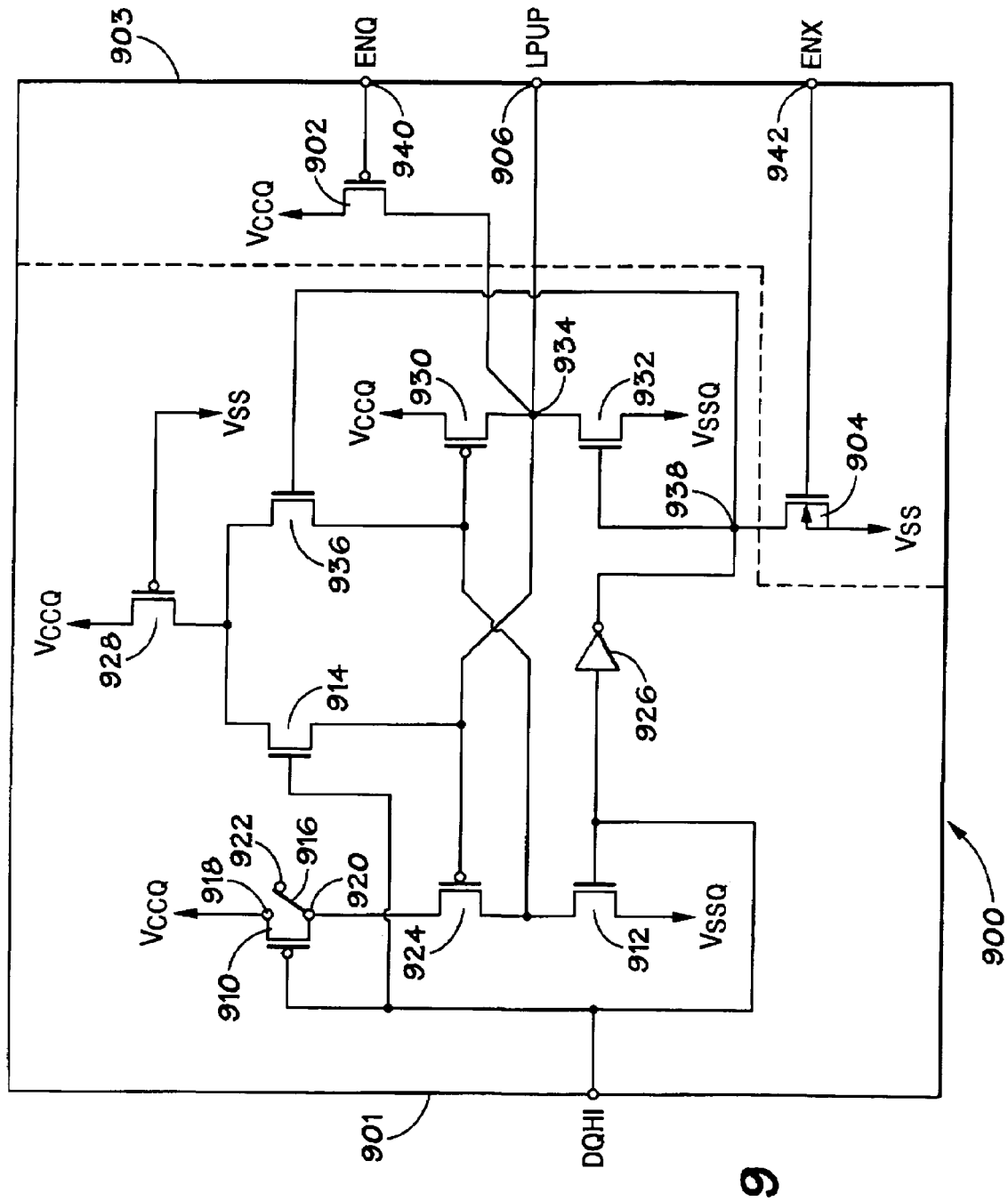
FIG. 9 illustrates a schematic diagram depicting an exemplary embodiment of a pull-up level shifter utilized with output buffer circuitry in the semiconductor chip of FIG. 3.

In FIG. 9, a schematic diagram depicting an exemplary embodiment of a pull-up level shifter 900 that may be utilized in the output buffer circuitry 322 is illustrated. The pull-up level shifter 900 may receive a first enable signal ENQ_and a second enable signal ENX, which are complimentary signals and associated with the deep power down mode. Through the use of these signals ENQ_ and ENX, grounding devices, such as a first transistor 902 and a second transistor 904, may be utilized to control the state of the pull-up level shifter 900. As a result, the output signal LPUP from the output terminal 906 may be forced into a high state when the deep power down mode is indicated.

The pull-up level shifter 900 may include a first portion 901 and a second portion 903. The first portion 901 of the pull-up level shifter 900 may provide the control signals for the pull-up level shifter 900 during the normal mode of operation. The first portion 901 may receive control signals that are utilized to provide the appropriate output signal. For instance, the pull-up level shifter 900 may include a first input terminal 908 that receives an external control signal DQHI, which may correspond to the external voltage source $V_{CCX}$. The first input terminal 908 may be coupled to the gates of transistors 910–914 and an inverter 926. The transistor 910 may be connected to a first switch terminal 918, which is coupled to the output pad voltage source $V_{CCQ}$, and a gate 920 of the switch 916 through the respective source and drain. The gate 920 of the switch 916 may be coupled to a second terminal 922 of the switch 916. A transistor 924 may be coupled in series with the transistor 912 between the gate 920 and a low output pad voltage source $V_{SSQ}$ through the respective sources and drains. The output pad voltage $V_{SSQ}$ may be a lower voltage than the output pad voltage source $V_{CCQ}$ or ground. The transistor 914 may be coupled between a transistor 928 that is coupled to the output pad voltage source $V_{CCQ}$ and the gate of the transistor 924, the output terminal 906, a drain of a transistor 930, and a source of a transistor 932 at a node 934. The gate of the transistor 928 may be coupled to the low output pad voltage source $V_{SSQ}$ or ground. The transistor 930 and the transistor 932 may be coupled in series between the output pad voltage source $V_{CCQ}$ and the low output pad voltage source $V_{SSQ}$. A transistor 936 may be coupled through the source and drain from the transistor 928 and the transistor 914 to a gate of the transistor 930 and between the transistor 912 and transistor 924. A gate of the transistor 936 is coupled to an output of the inverter 926, a gate of the transistor 932, and a source of the transistor 904 at a node 938. As an example of a specific embodiment, the transistors 904, 912, 914, 932 and 936 may be N-channel (MOSFET) transistors, while the transistors 902, 910, 924, 928 and 930 may be P-channel (MOSFET) transistors.

The second portion 903 of the pull-up level shifter 900 may force the pull-up level shifter 900 into the high state when deep power down mode is indicated. The second portion 903 may include a second input terminal 940 for receiving the first enable signal ENQ_ and a third input terminal 942 for receiving the second enable signal ENX. The second input terminal 940 connects to a gate of the transistor 902, which is coupled in series between the output pad voltage source $V_{CCQ}$ and the output terminal 906 at a node 934. The third input terminal 942 connects to a gate of the transistor 904, which is coupled in series between the a low voltage source $V_{SS}$ or ground and the output of the inverter 926 at a node 938.

To operate the pull-up level shifter 900, the enable signals ENQ_ and ENX may be utilized to control the pull-up level shifter 900. The enable signals ENQ_ and ENX may be the complimentary signals that represent the deep power down mode. For instance, if the first enable signal ENQ_ is the complimentary deep power down signal DPD_ and the second enable signal ENX is the deep power down signal DPD, the deep power down mode may be indicated by the first enable signal ENQ_ being "low" and the second enable signal ENX being "high." If the first transistor is a P-channel (MOSFET) transistor, then the gate of the first transistor 902 may be closed. This couples the output terminal 906 to the output pad voltage source $V_{CCQ}$. As a result, the output signal LPUP at the output terminal 906 may be forced into a high state. However, if the deep power down mode is not indicated, then the first enable signal ENQ_ is "high" and the second enable signal ENX is "low." As such, the external control signal DQHI applied at the first input terminal 908 may control the output signal LPUP.

From the pull-up level shifter 900, two different modes of operation are utilized to produce signals. First, if the first enable ENQ_ is "high" and the second enable signal ENX is "low," then the output signal LPUP may be a result of the external control signal DQHI and the components of the first section 901. However, if the first enable ENQ_ is "low" and the second enable signal ENX is "high," then the output signal LPUP may be forced into a high state regardless of the external control signal DQHI. Specifically, with the first enable signal ENQ_ being "low," the gate for the transistor 902 may close to couple the output voltage source $V_{CCQ}$ to the output terminal 906. Also, the gate of the transistor 924 is coupled to the output pad voltage source $V_{CCQ}$, which prevents the gate of the transistor 924 from closing, regardless of the external control signal DQHI. With the second enable signal ENX being "high," the gate of the transistor 904 may be closed to couple the gate of the transistor 932 to a low voltage source $V_{SS}$ or ground. This prevents the gate of the transistor 932 from closing, regardless of the external control signal DQHI. As a result, the output signal LPUP is forced into a high state when the deep power down mode is indicated. In addition, no leakage paths exist from the output pad voltage source $V_{CCQ}$ to ground because the gates of the transistor 924 and the transistor 932 are forced "open."

Figure 10:
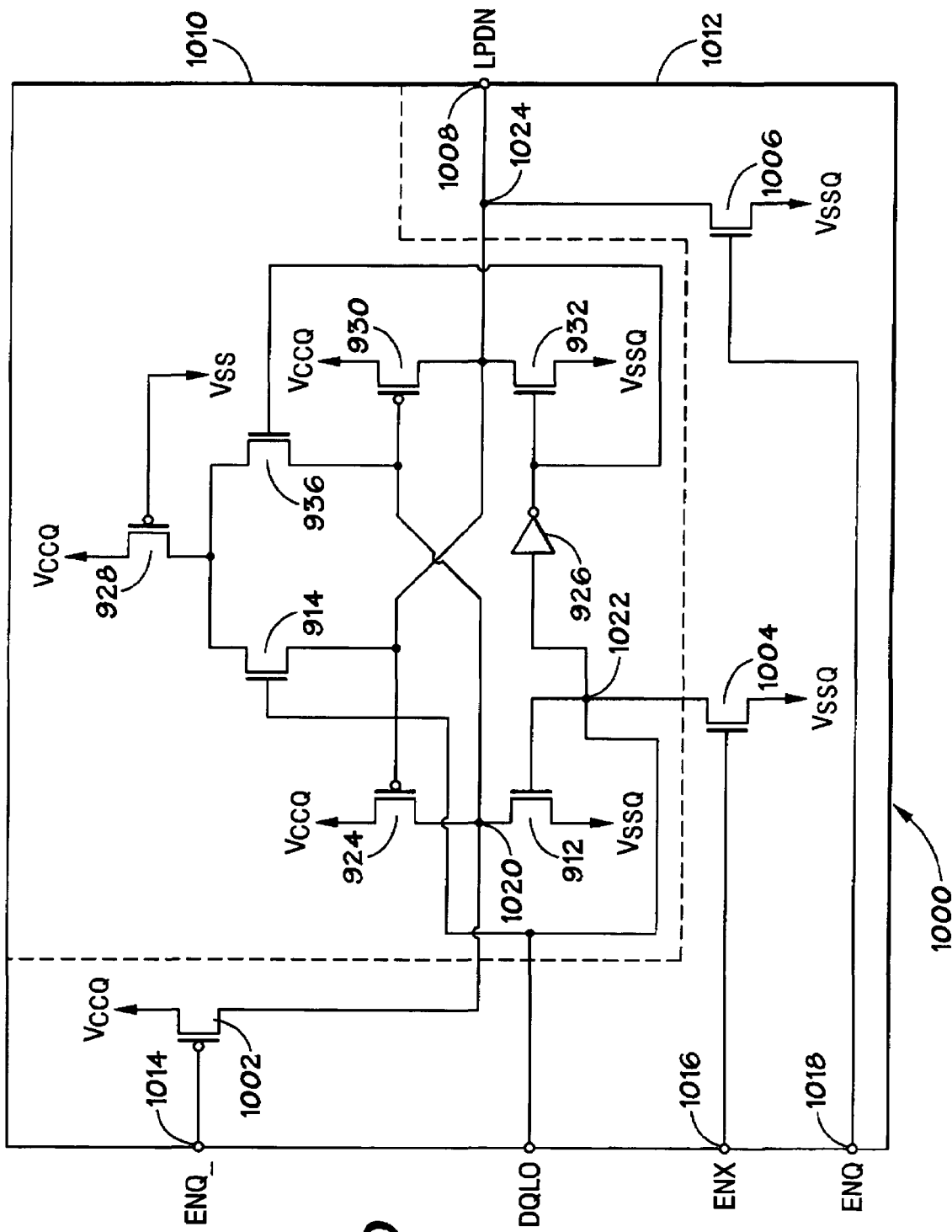
FIG. 10 illustrates a schematic diagram depicting an exemplary embodiment of a pull-down level shifter utilized with output buffer circuitry in the semiconductor chip of FIG. 3.

Similarly, in FIG. 10, a schematic diagram depicting an exemplary embodiment of a pull-down level shifter 1000 that may be utilized in the output buffer circuitry 322 is illustrated. The pull-down level shifter 1000 may receive a first enable signal ENQ_, a second enable signal ENX, and a third enable signal ENQ, which are associated with the deep power down mode. Through the use of these enable signals ENQ_, ENX and ENQ, deep power down mode devices, such as a transistors 1002, 1004 and 1006, may be utilized to control the state of the pull-down level shifter 1000. As a result, the output signal LPDN from the output terminal 1008 may be forced into a low state when the deep power down mode is indicated.

The pull-down level shifter 1000 may include a first portion 1010 and a second portion 1012. The first portion 1010 of the pull-down level shifter 1000 may provide the output signals from the pull-down level shifter 1000 during the normal mode of operation. The first portion 1010 may receive a control signal, such an external control signal DQLO, which is utilized to provide the appropriate output signal LPDN. The external control signal DQLO may relate to the external voltage source $V_{CCX}$. Similar to the discussion of the first portion 901 of the pull-up level shifter 900 of FIG. 9, some of the same components may be utilized in the first portion 1010 of the level shifter 1000. However, in the first portion 1010, the gate 920 of the switch 916 may be coupled to the first terminal 918, which is a short circuit to the output pad voltage source $V_{CCQ}$. That is the transistor 924 may be coupled between the output pad voltage source $V_{CCQ}$ and the transistor 912 through the respective source and drain. In this configuration, the output signal LPDN may be based on the external control signal DQLO.

The second portion 1012 of the pull-down level shifter 1000 may force the pull-down level shifter 1000 into a low state when deep power down mode is indicated. The second portion 1012 may include a second input terminal 1014 for receiving the first enable signal ENQ_, a third input terminal 1016 for receiving the second enable signal ENX, and a fourth input terminal 1018 for receiving the third enable signal ENQ. The second input terminal 1014 may connect to a gate of the transistor 1002. A source of the transistor 1002 may be coupled to the output pad voltage source $V_{CCQ}$, while the drain of the transistor 1002 may be coupled between the transistor 924 and the transistor 912 at a node 1020. The third input terminal 1016 may connect to a gate of the transistor 1004, which may be coupled in series between the a low voltage source $V_{SS}$ or ground and the gate of the transistor 912 at a node 1022. The fourth input terminal 1018 may connect to a gate of the transistor 1006, which may couple in series between the a low output pad voltage source $V_{SSQ}$ or ground and the output terminal 1008 at a node 1024. As an example of a specific embodiment, the transistors 1004, 912, 914, 932, 936 and 1006 may be N-channel (MOSFET) transistors, while the transistors 1002, 910, 924, 928 and 930 may be P-channel (MOSFET) transistors.

To operate the pull-down level shifter 1000, the enable signals ENQ_, ENX, and ENQ may be utilized to control the pull-down level shifter 1000 when the internal voltage buses are grounded. The enable signals ENQ and ENQ_ may be the complimentary signals that represent the deep power down mode, while the enable signals ENQ and ENX may be signals that have similar attributes. For instance, the first enable signal ENQ may correspond to the complimentary deep power down signal DPD_ and the second enable signal ENX and the third enable signal ENQ may correspond to the deep power down signal DPD. Accordingly, the deep power down mode may be indicated by the first enable signal ENQ_ being "low" and the second and third enable signals ENX and ENQ being "high." In the deep power down mode, the transistor 1002 and the transistor 1004 may be closed to prevent the gates of the transistor 930 and the transistor 912 from closing. Also, the transistor 1006 may be utilized to force the output signal LPDN into a low state by coupling the output terminal 1008 to the low output pad voltage $V_{SSQ}$. When the pull-down level shifter 1000 is in the normal mode of operation, the transistors 1002–1006 are open and the external control signal DQLO may control the output signal LPDN.

For the pull-down level shifter 1000, two different modes of operation are utilized to produce signals. First, in the normal mode of operation, the first enable ENQ_ is "high" and the second and third enable signals ENQ and ENX are "low." As a result, the output signal LPDN may depend on the external control signal DQLO and the components of the first section 1010. However, in the deep power down mode, the first enable ENQ_ is "low" and the second and third enable signals ENX and ENQ are "high." With the first enable signal ENQ_ being "low," the gate for the first transistor 1002 may close to couple the output pad voltage source $V_{CCQ}$ to the gate of the transistor 930. This prevents the gate of the transistor 930 from closing, regardless of the external control signal DQLO. Similarly, with the second enable signal ENX being "high," the gate of the transistor 1004 may be closed to couple the gate of the transistor 912 to a low output pad voltage source $V_{SSQ}$ or ground. This forces the gate of the transistor 912 to remain "open." Also, with the third enable signal ENQ being "high," the gate of the transistor 1006 may be closed to couple the output terminal 1008 and the low output pad voltage source $V_{SSQ}$ or ground. This forces the output signal LPDN into the low state. As a result, the output signal LPDN is forced into a low state when a deep power down mode is indicated. In addition, no leakage paths exist from the output pad voltage source $V_{CCQ}$ to ground because the gates of the transistor 912 and the transistor 930 are forced "open."

Advantageously, by forcing the outputs of the level shifters 900 and 1000 into either "low" or "high" states, the output signals may be placed into a specified state during the deep power down mode. This means that the level shifters 900 and 1000 may slowly discharge or charge the internal nodes so that the output signals turn "off" the pull-up and pull-down drivers of the output buffer circuitry 322 of FIG. 3. As a result, the pull-up level shifter 900 and the pull-down level shifter 1000 may be utilized in the output buffer circuitry 322 to enhance the operation of the system in a deep power down mode. An exemplary embodiment of output buffer circuitry, which may be the output buffer circuitry 322 of FIG. 3, is shown in greater detail in FIG. 11.

Figure 11A:
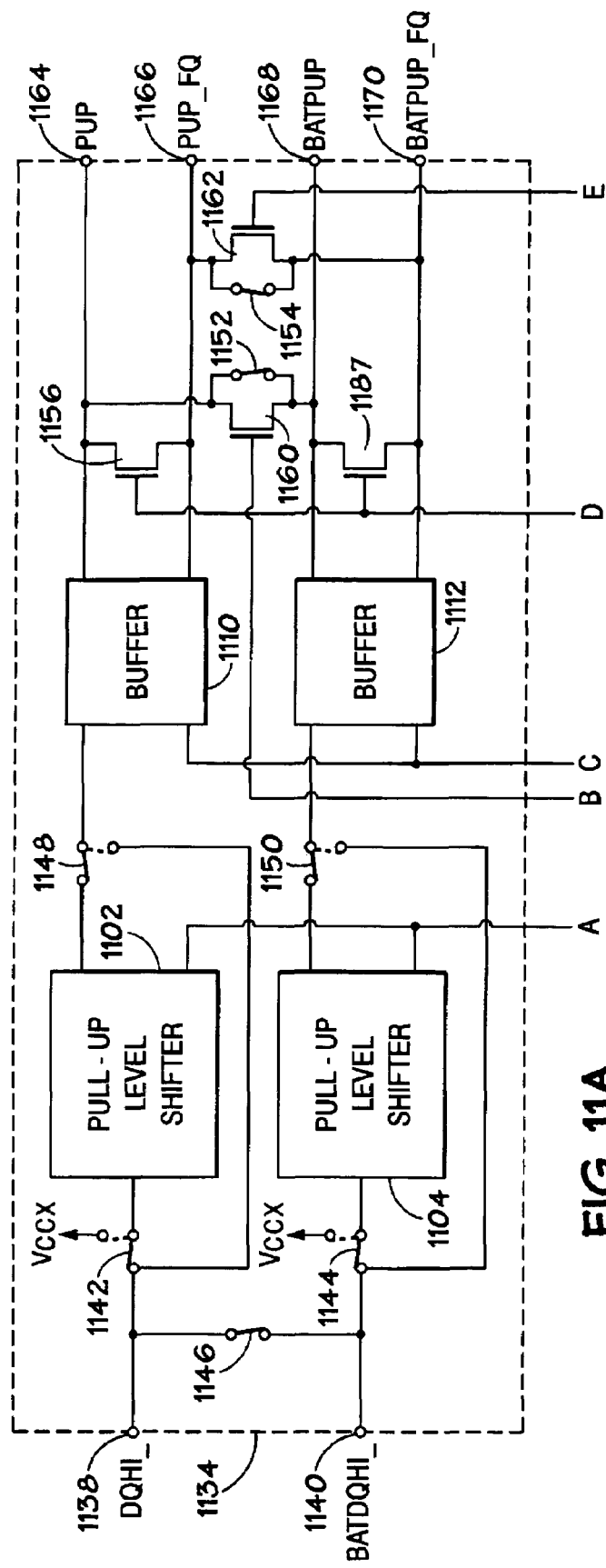
FIGS. 11A and 11B illustrate a schematic diagram depicting an exemplary embodiment of the output buffer circuitry that includes the level shifters of FIGS. 9 and 10.
Figure 11B:
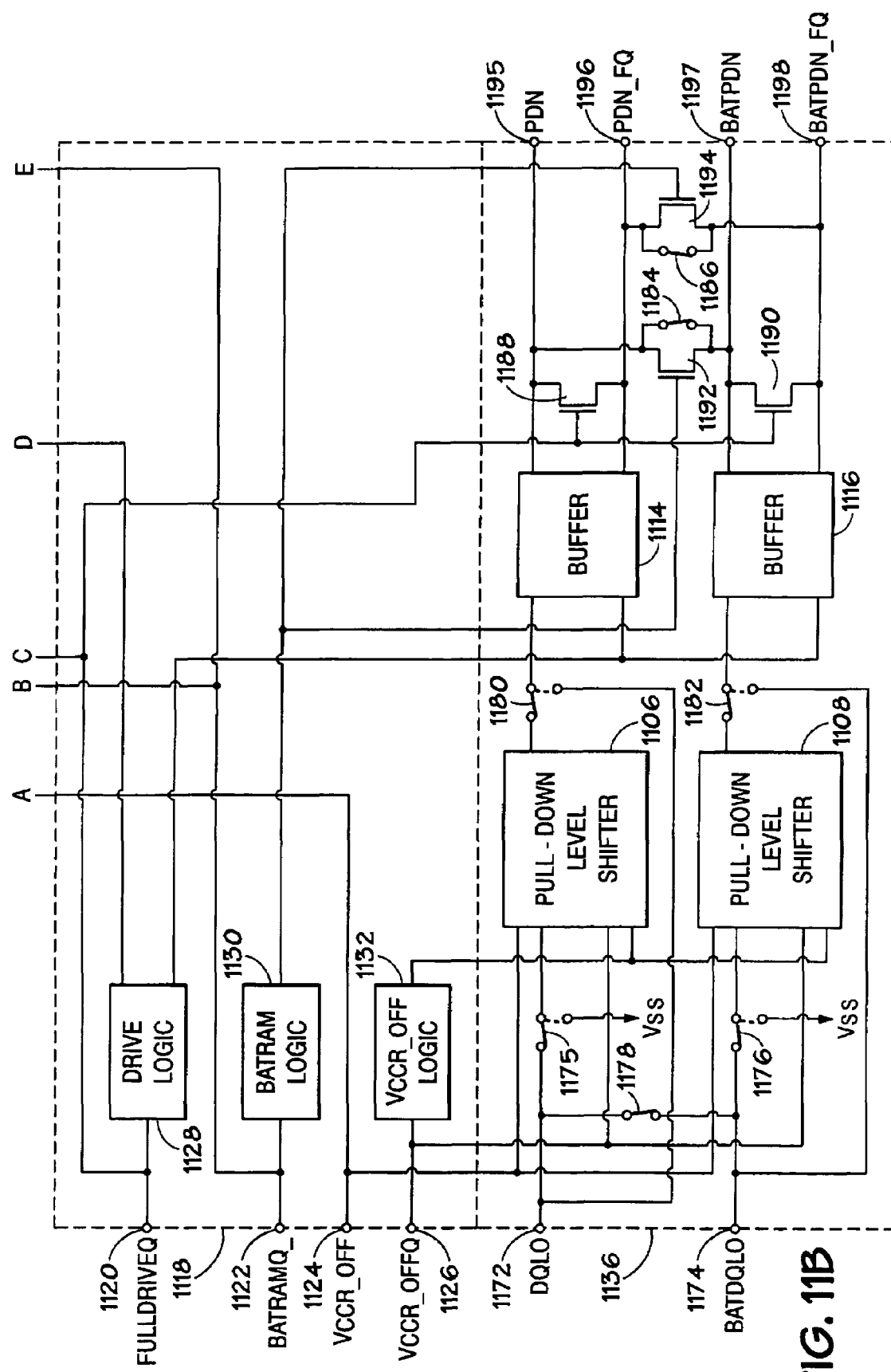

In FIGS. 11A and 11B, a schematic diagram depicting an exemplary embodiment of the output buffer circuitry 322 that includes level shifters, such as the pull-up level shifter 900 and the pull-down level shifter 1000, is illustrated. The pull-up level shifters, such as the first pull-up level shifter 1102 and the second pull-up level shifter 1104, may be utilized along with the pull-down level shifters, such as a first pull-down level shifter 1106 and a second pull-down level shifter 1108, to provide output signals in specific states to buffers 1110–1116. This allows the output buffer circuitry 322 to utilize the level shifters 1102–1108 to provide the proper polarity to turn "off" the pull-up or pull-down drivers of the buffers 1110–1116.

The output buffer circuitry 322 may include three different sections to provide the output signals. As shown in FIG. 11B, the first section 1118 of the output buffer circuitry 322 may provide control signals and logic to the level shifters 1102–1108, the buffers 1110–1116, and other logic. The first section 1118 may include input signals, such as a battery control signal BATRAMQ_, a driver control signal FULLDRIVEQ, and operating voltage status control signals VCCR_OFF and VCCR_OFFQ. The operating voltage status control signals VCCR_OFF and VCCR_OFFQ may be local control signals that are generated by functions of deep power down signals, wafer level burn in signals, regulated (XVHI) verses unregulated (XVLO) signals, and double data rate (DDR) verses single data rate (SDR) signals, as discussed above. The input signals may be received at a first input terminal 1120, a second input terminal 1122, a third input terminal 1124, and a fourth input terminal 1126. The input signals may be delivered to various logic, such as drive logic 1128, battery control (BATRAM) logic 1130, and operating voltage status control (VCCR_OFF) logic 1132. The drive logic 1128 may provide additional drive control signals, such as a pull-up driver control signal FULLDRIVEQ and a pull-down control signal FULLDRIVEQN_. The BATRAM logic 1130 may also provide a complimentary battery control signal BATRAMQ, while the VCCR_OFF logic 1132 may provide a complimentary operating voltage status control signal VCCR_OFFQ_. These various signals may be provided to level shifters 1102–1108, the buffers 1110–1116 and other logic in a second section 1134 and a third section 1136.

The second section 1134, which is shown in FIG. 11A, may include the pull-up circuitry for the output buffer circuitry 322. Specifically, the second section 1134 may include the pull-up level shifters 1102 and 1104, which may be embodiments of the pull-up level shifter 900 of FIG. 9. The level shifters 1102 and 1104 may utilize input signals from input terminals 1138 and 1140 and input signals from the first section 1118 to provide an output signal to the buffers 1110 and 1112. The connections between the second section 1134 and the first section 1118 are referenced by reference characters A, B, C, D and E. The input signals may include a data control signal DQHI that is received on a fifth input terminal 1138 and a battery control signal BATDQHI that is received on a sixth input terminal 1140. These input signals, along with the input signals from the first section 1118, may delivered to the level shifters 1102 and 1004, buffers 1110 and 1112, and various logic, such as switches 1142–1154 and transistors 1156–1162. From the output buffers 1110 and 1112 along with the various logic, output signals are provided to a first output terminal 1164, a second output terminal 1166, a third output terminal 1168 and a fourth output terminal 1170. These output signals may include output signals, such as pull-up output signals PUP and PUP_FQ and battery output signals BATPUP and BATPUP_FQ.

The third section 1136, which is shown in FIG. 11B, may include the pull-down circuitry for the output buffer circuitry 322. The third section 1136 may include the pull-down level shifters 1106 and 1108, which may be embodiments of the pull-down level shifter 1000 of FIG. 10. The level shifters 1106 and 1108 may utilize input signals from input terminals 1172 and 1174 and from the first section 1118 to provide output signals to the buffers 1114 and 1116. The input signals may include a data control signal DQLO that is received on a seventh input terminal 1172 and a battery control signals BATDQLO that is received on an eighth input terminal 1174. These input signals, along with the input signals from the first section 1118, may be delivered to the level shifters 1106 and 1008, buffers 1114 and 1116, and various logic, such as switches 1175–1186 and transistors 1188–1194. From the output buffers 1114 and 1116 and the various logic, output signals are provided to a fifth output terminal 1195, a sixth output terminal 1196, a seventh output terminal 1197 and an eighth output terminal 1198. These output signals of the third section 1136 may include output signals, such as pull-down output signals PDN and PDN_FQ and battery output signals BATPDN and BATPDN_FQ.

With the signals from the first section 1118 and the input terminals 1138–1140 and 1170–1172, the level shifters 1102–1108 may provide output signals in specific states to the buffers 1110–1116, when the power down mode is indicated, as discussed above with reference to FIGS. 9 and 10. For instance, each of the level shifters 1102–1108 may be coupled to the control signal VCCR_OFF, while the level shifters 1106 and 1108 may also be coupled to the control signals VCCR_OFFQ and VCCR_OFFQ. The control signals VCCR_OFF, VCCR_OFFQ and VCCR_OFFQ may indicate that the deep power down mode is active. This allows the output buffer circuitry 322 to utilize the level shifters 1102–1108 to provide signals with the proper polarity to turn "off" the pull-up or pull-down drivers of the buffers 1110–1116. As a result, the propagation timing of the output circuitry 322 is maintained, while the no additional space-consuming devices are utilized in the device.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A system comprising:
   a processor; and
   a memory device coupled to the processor and comprising:
      a regulator control coupled to an external voltage source; and
      a plurality of internal voltage buses coupled to the regulator control to provide power to a plurality of circuits, wherein the plurality of internal voltage buses comprises an array voltage bus that provides an array voltage to array circuitry, and wherein at least one of the plurality of internal voltage buses comprises a plurality of control circuitry having at least one level shifter configured to:
         receive at least one disable signal and at least one data signal;
         provide a determined output signal when the at least one disable signal corresponds to a deep power down mode; and
         provide an output signal that is based on the at least one data signal when the at least one disable signal does not correspond to the deep power down mode.

2. The system, as set forth in claim 1, wherein the plurality of internal voltage buses comprises an operating voltage bus that provides an operating voltage to output buffer circuitry.

3. The system, as set forth in claim 1, wherein the processor is coupled to a communication port.

4. The system, as set forth in claim 1, wherein the processor is coupled to an input device.

5. The system, as set forth in claim 1, wherein the processor is coupled to a display.

6. The system, as set forth in claim 1, wherein the control circuitry comprises at least one of an operating voltage control circuitry and a delay lock loop control circuitry.

7. The system, as set forth in claim 6, wherein the at least one level shifter in the at least one of an operating voltage control circuitry and a delay lock loop control circuitry comprises:
   a first transistor coupled between a first output terminal and a low voltage source; and
   a second transistor coupled between a second output terminal and the low voltage source, wherein the first and second transistors are configured to:
      receive the at least one disable signal;
      couple the first output terminal and the second output terminal to the low voltage source if the at least one disable signal corresponds to the deep power down mode; and
      isolate the first output terminal and the second output terminal from the low voltage source if the at least one disable signal does not correspond to the deep power down mode.

8. The system, as set forth in claim 7, wherein the at least one level shifter in the at least one of an operating voltage control circuitry and the delay lock loop control circuitry comprises a third transistor coupled between the external voltage source and level shifter circuitry, wherein the third transistor is configured to:
   receive the at least one disable signal;
   isolate the level shifter circuitry from the external voltage source if the at least one disable signal does not correspond to the deep power down mode; and
   couple the level shifter circuitry to the external voltage source if the at least one disable signal corresponds to the deep power down mode.

9. The system, as set forth in claim 1, wherein the regulator control comprises a plurality of grounding devices coupled between one of the plurality of internal voltage buses and a low voltage source, wherein each of the plurality of grounding devices is configured to:
   receive the at least one disable signal;
   isolate the one of the plurality of internal voltage buses from the low voltage source if the at least one disable signal does not correspond to the deep power down mode; and
   couple the one of the plurality of internal voltage buses to the low voltage source if the at least one disable signal corresponds to the deep power down mode.

10. The system, as set forth in claim 9, wherein the one of the plurality of grounding devices comprises:
   a transistor having a drain, a source, and a gate;
   wherein the drain of the transistor is coupled between a resistor coupled to the one of the plurality of internal voltage buses and a voltage logic coupled to an external voltage source;
   the source of the transistor coupled to the low voltage source; and
   the gate of the transistor coupled to an input configured to receive the at least one disable signal.

11. A system comprising:
a processor; and
a memory device coupled to the processor and comprising:
- a regulator control coupled to an external voltage source;
- an internal voltage bus coupled to the regulator control to receive power from the regulator control; and
- an output buffer circuitry coupled to the internal voltage bus and having at least one level shifter, the output buffer circuitry configured to:
  - receive at least one disable signal and at least one data signal, wherein the at least one data signal comprises a first disable signal and a second disable signal;
  - provide a predetermined output signal if the at least one disable signal corresponds to a deep power down mode, regardless of the at least one data signal; and
  - provide an output signal that is based on the at least one data signal if the at least one disable signal does not correspond to the deep power down mode.

12. The system, as set forth in claim 11, wherein the at least one level shifter in the output buffer circuitry comprises:
- a first transistor coupled between an output terminal and an output pad voltage source, the first transistor configured to:
  - receive the first disable signal;
  - couple the output terminal to the output pad voltage source if the first disable signal corresponds to the deep power down mode; and
  - isolate the output terminal to the output pad voltage source if the first disable signal does not correspond to the deep power down mode.

13. The system, as set forth in claim 12, wherein the at least one level shifter in the output buffer circuitry comprises:
- a second transistor coupled between the output terminal and a low output pad voltage source, and
- a third transistor coupled between a gate of the second transistor and a low voltage source,
- wherein the third transistor is configured to:
  - receive the second disable signal;
  - prevent the second transistor from coupling the output terminal to the low output pad voltage source if the second disable signal corresponds to the deep power down mode; and
  - permit the second transistor to couple the output terminal to the output pad voltage source if the second disable signal does not correspond to the deep power down mode.

14. A system comprising:
a processor; and
a memory device coupled to the processor and comprising:
- a regulator control coupled to an external voltage source;
- an internal voltage bus coupled to the regulator control to receive power from the regulator control; and
- an output buffer circuitry coupled to the internal voltage bus and having at least one level shifter, the output buffer circuitry configured to:
  - receive at least one disable signal and at least one data signal, wherein the at least one data signal comprises a first disable signal, a second disable signal, and a third disable signal;
  - provide a predetermined output signal if the at least one disable signal corresponds to a deep power down mode, regardless of the at least one data signal; and
  - provide an output signal that is based on the at least one data signal if the at least one disable signal does not correspond to the deep power down mode.

15. The system, as set forth in claim 14, wherein the at least one level shifter in the output buffer circuitry comprises:
- a first transistor coupled between an output terminal and a low output pad voltage source, wherein the first transistor is configured to:
  - receive the first disable signal;
  - couple the output terminal to the low output pad voltage source if the first disable signal corresponds to the deep power down mode; and
  - isolate the output terminal from the low output pad voltage source if the first disable signal does not correspond to the deep power down mode.

16. The system, as set forth in claim 15, wherein the at least one level shifter in the output buffer circuitry comprises:
- a second transistor coupled between a gate of a third transistor and an output pad voltage source, wherein the second transistor is configured to:
  - receive the second disable signal;
  - prevent the gate of the third transistor from closing if the second disable signal corresponds to the deep power down mode; and
  - permit the gate of the third transistor to close if the second disable signal does not correspond to the deep power down mode.

17. The system, as set forth in claim 16, wherein the at least one level shifter in the output buffer circuitry comprises:
- a fourth transistor coupled between a gate of a fifth transistor and the low output pad voltage source, wherein the fourth transistor is configured to:
  - receive the third disable signal;
  - prevent the gate of the fifth transistor from closing if the third disable signal corresponds to the deep power down mode; and
  - permit the gate of the fifth transistor to close if the third disable signal does not correspond to the deep power down mode.

18. A memory device comprising:
a regulator control coupled to an external voltage source;
a voltage bus coupled to the regulator control to provide power to a plurality of circuits, a control circuitry coupled to the voltage bus having a level shifter that is configured to:
- receive a disable control signal and a data signal;
- provide a predetermined output signal when the disable control signal corresponds to a deep power down mode;
- provide an output signal that is based on the data signal when the disable control signal does not correspond to a deep power down mode,
- wherein the level shifter comprises:
  - a first transistor coupled between a first output terminal and a low voltage source; and
  - a second transistor coupled between a second output terminal and the low voltage source.

19. The memory device, as set forth in claim 18, wherein the memory device comprises a dynamic random access memory (DRAM) device.

20. The memory device, as set forth in claim 18, wherein the memory device comprises a static random access memory (SRAM) device.

21. The memory device, as set forth in claim 18, wherein the regulator control comprises a grounding device configured to ground the voltage bus when a deep power down signal is received at the regulator control.

22. The memory device, as set forth in claim 18, wherein the plurality of circuits comprises output buffer circuitry.

23. The memory device, as set forth in claim 18, wherein the plurality of circuits comprises delay lock loop circuitry.

24. The memory device, as set forth in claim 18, wherein the first and second transistors are configured to:
  receive the disable control signal;
  couple the first output terminal and the second output terminal to the low voltage source if the disable control signal corresponds to the deep power down mode; and
  isolate the first output terminal and the second output terminal from the low voltage source if the disable control signal does not correspond to the deep power down mode.

25. The memory device, as set forth in claim 24, the level shifter comprises a third transistor coupled between the external voltage source and level shifter circuitry, wherein the third transistor is configured to:
  receive the disable control signal;
  isolate the level shifter circuitry from the external voltage source if the disable control signal does not correspond to the deep power down mode; and
  couple the level shifter circuitry to the external voltage source if the disable control signal corresponds to the deep power down mode.

26. A method of achieving low power consumption during a deep power down mode, the method comprising:
  receiving an external voltage and a control signal at a regulator control;
  grounding a plurality of internal voltage buses at the regulator control if the control signal indicates a deep power down mode, wherein grounding the plurality of internal voltage buses comprises closing a plurality of gates on each of a plurality of transistors to couple the plurality of internal voltage buses to ground; and
  providing a plurality of voltages to the plurality of internal voltage buses from the regulator control if the control signal does not indicate the deep power down mode.

27. The method, as set forth in claim 26, comprising the act of isolating the plurality of internal voltage buses from ground if the control signal does not indicate the deep power down mode.

28. The method, as set forth in claim 26, wherein the plurality of internal voltage buses comprise at least one of an operating voltage bus, a delay lock loop voltage bus, and an array voltage bus.

29. The method, as set forth in claim 26, wherein the plurality of internal voltage buses comprise a booted power voltage bus.

30. A method of providing a deep power down mode, the method comprising:
  receiving at least one disable control signal and a data signal at a level shifter;
  providing a predetermined output signal when the at least one disable control signal corresponds to a deep power down mode; and
  providing an output signal based on the data signal when the at least one disable control signal does not correspond to the deep power down mode.

31. The method, as set forth in claim 30, comprising:
  coupling a first output terminal and a second output terminal to ground if the at least one disable control signal indicates the deep power down mode; and
  isolating the first output terminal and the second output terminal from ground if the at least one disable control signal does not indicate the deep power down mode.

32. The method, as set forth in claim 31, comprising:
  isolating the level shifter circuitry from an external voltage source if the at least one disable control signal does not indicate the deep power down mode; and
  coupling the level shifter circuitry to the external voltage source if the at least one disable control signal indicates the deep power down mode.

33. The method, as set forth in claim 30, wherein the at least one data signal comprises a first disable signal and a second disable signal.

34. The method, as set forth in claim 33, wherein providing a predetermined output signal comprises coupling an output terminal to an output pad voltage source if the first disable signal indicates the deep power down mode; and
  wherein providing an output signal comprises isolating the output terminal from the output pad voltage source if the first disable signal does not indicate the deep power down mode.

35. The method, as set forth in claim 34, wherein providing a predetermined output signal comprises preventing the first transistor from coupling the output terminal to the low output pad voltage source if the second disable signal indicates the deep power down mode; and
  wherein providing an output signal comprises permitting the first transistor to couple the output terminal with the output pad voltage source if the second disable signal does not indicate the deep power down mode.

36. The method, as set forth in claim 30, wherein the at least one data signal comprises a first disable signal, a second disable signal, and a third disable signal.

37. The method, as set forth in claim 36, wherein providing a predetermined output signal comprises coupling an output terminal to a low output pad voltage source if the first disable signal indicates the deep power down mode; and
  wherein providing an output signal comprises isolating the output terminal from the low output pad voltage source if the first disable signal does not indicate the deep power down mode.

38. The method, as set forth in claim 37, wherein providing a predetermined output signal comprises coupling a gate of a first transistor to an output pad voltage source if the second disable signal indicates to the deep power down mode; and
  wherein providing an output signal comprises isolating the gate of the first transistor from the output pad voltage source if the second disable signal does not indicate to the deep power down mode.

39. The method, as set forth in claim 38, wherein providing a predetermined output signal comprises coupling a gate of a second transistor to the low output pad voltage source if the third disable signal indicates to the deep power down mode; and
  wherein providing an output signal comprises isolating the gate of the second transistor from the low output pad voltage source if the third disable signal does not indicate to the deep power down mode.

* * * * *